(12) United States Patent
Koester et al.

(10) Patent No.: US 8,587,121 B2
(45) Date of Patent: Nov. 19, 2013

(54) BACKSIDE DUMMY PLUGS FOR 3D INTEGRATION

(75) Inventors: Steven J. Koester, Ossining, NY (US); Fei Liu, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 521 days.

(21) Appl. No.: 12/730,403

(22) Filed: Mar. 24, 2010

(65) Prior Publication Data
US 2011/0233785 A1    Sep. 29, 2011

(51) Int. Cl.
*H01L 23/40*    (2006.01)

(52) U.S. Cl.
USPC .......................... 257/773; 438/107; 438/667

(58) Field of Classification Search
USPC ........... 257/773, E23.174, E21.585, E21.499, 257/734; 438/667, 107
See application file for complete search history.

(56) References Cited

U.S. PATENT DOCUMENTS

| | | | |
|---|---|---|---|
| 7,531,407 | B2 | 5/2009 | Clevenger et al. |
| 2002/0148639 | A1* | 10/2002 | Smith et al. ............... 174/255 |
| 2007/0001266 | A1 | 1/2007 | Arana et al. |
| 2007/0085198 | A1 | 4/2007 | Shi et al. |
| 2007/0117348 | A1 | 5/2007 | Ramanathan et al. |
| 2007/0163769 | A9 | 7/2007 | Li et al. |
| 2008/0020488 | A1* | 1/2008 | Clevenger et al. .............. 438/3 |
| 2008/0079121 | A1 | 4/2008 | Han |

OTHER PUBLICATIONS

Patel, Jitendra, "Through Silicon Vias Process Integration with Concentration on a Diffusion Barrier, Backside Processing, and Electrical Characteristics" vol. 46/01 of Masters of Abstracts, p. 469 (2006) Order No. AADAA-I1445624 (Abstract Only).
International Search Report dated Feb. 8, 2011.

\* cited by examiner

*Primary Examiner* — Julio J Maldonado
*Assistant Examiner* — Robert Bachner
(74) *Attorney, Agent, or Firm* — Scully, Scott, Murphy & Presser, P.C.; Louis J. Percello, Esq.

(57) ABSTRACT

A semiconductor structure includes backside dummy plugs embedded in a substrate. The backside dummy plugs can be a conductive structure that enhances vertical thermal conductivity of the semiconductor structure and provides electrical decoupling of signals in through-substrate vias (TSVs) in the substrate. The backside dummy plug can include a cavity to accommodate volume changes in other components in the substrate, thereby alleviating mechanical stress in the substrate during thermal cycling and operation of the semiconductor chip. The backside dummy plug including the cavity can be composed of an insulator material or a conductive material. The inventive structures can be employed to form three-dimensional structures having vertical chip integration, in which inter-wafer thermal conductivity is enhanced, crosstalk between signals through TSVs is reduced, and/or mechanical stress to the TSVs is reduced.

16 Claims, 25 Drawing Sheets

BACKSIDE DUMMY PLUGS FOR 3D INTEGRATION

BACKGROUND

The present invention relates to a semiconductor structure including backside dummy plugs in a substrate and methods of manufacturing the same.

3D integration, or chip stacking, refers to a method of assembling two or more semiconductor chips so that the semiconductor chips that are placed in physical proximity to one another are also electrically connected among one another. 3D integration is typically performed vertically, i.e., one chip is placed above or below another chip. When two chips are brought together vertically, a set of conductive contact structures on the top surface of an underlying chip is aligned to another set of conductive contact structures on the bottom surface of an overlying chip. The conductive structures may be formed on the side of metal interconnect structures, or they may be formed on the side of a substrate on which semiconductor devices are formed.

3D integration may be performed between a pair of substrates, a substrate and a set of chips, or between multiple pairs of chips. 3D integration provides vertical signal paths between stacked chips, providing a wide bandwidth for transmitting and receiving electrical signals between stacked chips. The vertical signal paths are effected by through-substrate vias (TSVs), which are vias extending at least from a topmost surface of a semiconductor device layer in a substrate to a backside surface of the substrate. 3D integration effectively reduces the lengths of signal paths and allows faster transmission of electrical signals between various device components located in various portions of stacked semiconductor chips.

Limitations to the benefits of 3D integration are imposed by secondary effects of TSVs. Such limitations are caused, for example, by inter-wafer thermal conductivity, cross-talk between signals in TSVs, and structural reliability of TSVs throughout the operational lifetime of the stacked structure. These limitations to 3D integration can degrade the overall system level performance of a stacked structure of multiple semiconductor chips.

Addressing such challenges without sacrificing performance of semiconductor chips in the system can be difficult. For example, in order to enhance inter-wafer thermal conductivity to provide sufficient cooling of power-consuming chips (such as processor chips), it is desirable to have a large number of uniformly distributed TSV. However, formation of a large number of TSVs requires use of a large chip area for TSVs, thereby reducing the chip area available for use as active areas, i.e., areas in which semiconductor devices can be built. Increasing the number of TSVs has the effect of reducing the active areas or increasing the overall chip size, and may not be a viable solution in many instances.

As far as reduction of signal cross-talk is concerned, it is desirable to provide shielding structures that laterally surround TSVs to minimize signal couplings among electrical signals through the TSVs. However, formation of such shielding structures requires large active areas, rendering such an option practically unaffordable.

As far as enhancement of thermal reliability of the stacked chip structure is concerned, the mismatch between the coefficient of thermal expansion (CTE) of a semiconductor material in a semiconductor chip and the CTE of embedded conductive material that constitute the TSVs generate mechanical stress during temperature cycling at any subsequent high-temperature processing steps, including thermo-compression bonding steps, and during high-temperature operation of the stacked chip structure. Accumulation of stress in the TSVs can cause cracking in the stacked chip structure resulting in a structural reliability problem such as dislodging of some of the TSV and subsequently vertical movement of the TSVs within a semiconductor chip.

BRIEF SUMMARY

The present invention provides a semiconductor structure that includes backside dummy plugs embedded in a substrate. The backside dummy plugs can be a conductive structure that enhances vertical thermal conductivity of the semiconductor structure and provides electrical decoupling of signals in through-substrate vias (TSVs) in the substrate. The backside dummy plug can include a cavity to accommodate volume changes in other components in the substrate, thereby alleviating mechanical stress in the substrate during thermal cycling and operation of the semiconductor chip. The backside dummy plug including the cavity can be composed of an insulator material or a conductive material. The cavity can be formed in a straight trench, or formed as a bottle shaped trench having a greater lateral dimension than an opening of the trench. The inventive structures can be employed to form three-dimensional structures having vertical chip integration, in which inter-wafer thermal conductivity is enhanced, crosstalk between signals through TSVs is reduced, and/or mechanical stress to the TSVs is reduced. The backside dummy plugs in a three-dimensional interconnect structure can improve thermal conductivity, signal integrity of TSVs, and/or reliability of TSVs without requiring any additional active areas.

According to an aspect of the present invention, a semiconductor structure is provided, which includes a substrate including a semiconductor layer and an interconnect dielectric layer, a through-substrate via (TSV) structure embedded in the substrate, and at least one backside dummy plug embedded in the substrate. At least one semiconductor device is located at an interface between the semiconductor layer and the interconnect dielectric layer. The TSV structure includes a conductive material and extends at least from the interface to a back side surface of the substrate. The at least one backside dummy plug extends from the back side surface to a depth into the substrate. The depth is less than a vertical distance between the back side surface and the interface.

According to another aspect of the present invention, a method of forming a semiconductor structure is provided, which includes: forming at least one semiconductor device on a front side surface of a substrate; forming a through-substrate via (TSV) structure in the substrate, the TSV structure including a conductive material and extending at least from the front side surface to the back side surface; and forming at least one backside dummy plug in the substrate, the at least one backside dummy plug extending from the back side surface to a depth into the substrate, wherein the depth is less than a vertical distance between the front side surface and the back side surface.

DETAILED DESCRIPTION

Figure 1:
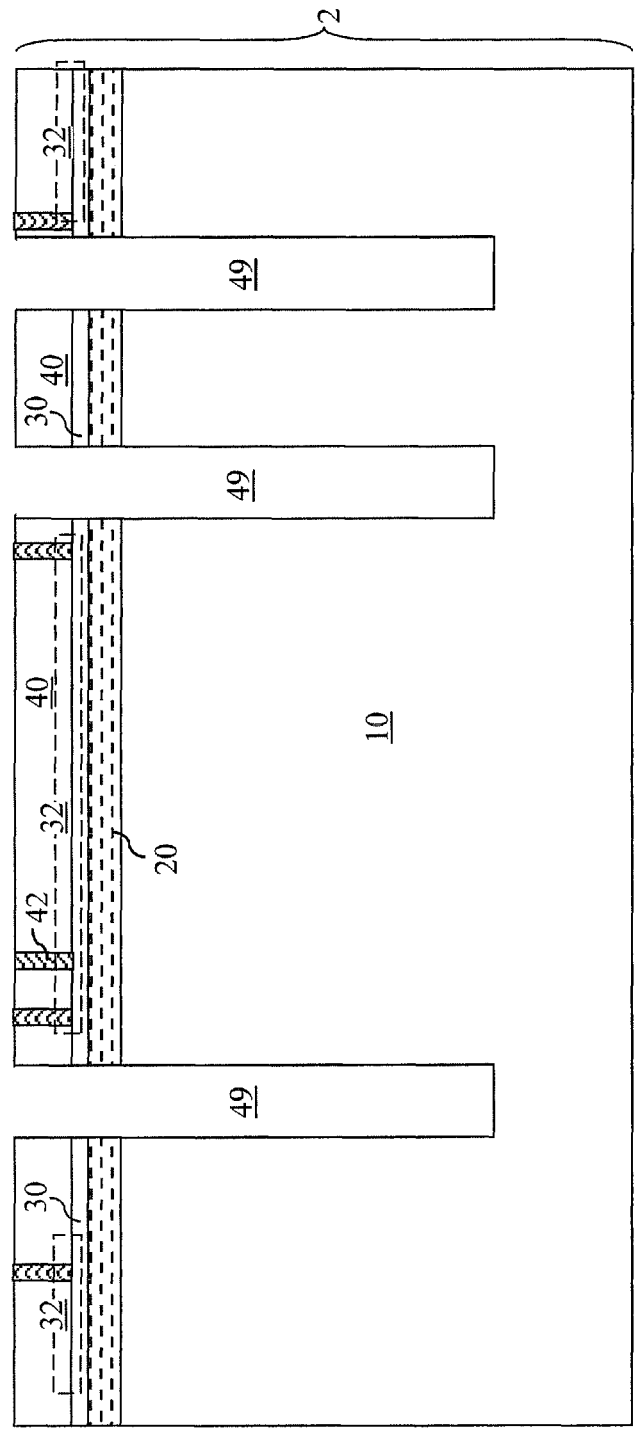
FIGS. 1-9 are sequential vertical cross-sectional views of a first exemplary semiconductor structure at various stages of a manufacturing process according to a first embodiment of the present invention.

As stated above, the present invention relates to a semiconductor structure including backside dummy plugs in a substrate and methods of manufacturing the same, which are now described in detail with accompanying figures. Throughout the drawings, the same reference numerals or letters are used to designate like or equivalent elements. The drawings are not necessarily drawn to scale.

As used herein, a "semiconductor chip" is a structure including at least one of an integrated circuit, a passive component such as a capacitor, a resistor, an inductor, or a diode, or a micro-mechanical-electrical structure (MEMS), or a combination thereof that may be formed on a substrate including a semiconductor material.

As used herein, an element is "electrically connected" to another element if there exists an electrically conductive path between said element and said other element.

As used herein, an element is "electrically insulated" from another element if there is no electrically conductive path between said element and said other element.

Referring to FIG. 1, a first exemplary semiconductor structure according to a first embodiment of the present invention includes a first substrate 2. The first substrate 2 can include a semiconductor-on-insulator (SOI) substrate, a bulk semiconductor substrate, or a hybrid substrate including at least one SOI portion and at least one bulk portion. If the first substrate 2 includes an SOI substrate, the SOI substrate can contain, from bottom to top, a first handle substrate 10, a first buried insulator layer 20, and a first top semiconductor layer 30.

The first handle substrate 10 can include a semiconductor material, a dielectric material, a conductive material, or a combination thereof. Typically, the first handle substrate 20 includes a semiconductor material. The thickness of the handle substrate 10 can be from 100 microns to 1,000 microns, although lesser and greater thicknesses can also be employed. The first buried insulator layer 20 includes a dielectric material such as silicon oxide, silicon nitride, and/or silicon oxynitride. The first top semiconductor layer 30 is composed of a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor material can be polycrystalline or single crystalline, and is preferably single crystalline. For example, the semiconductor material may comprise single crystalline silicon. The thickness of the first top semiconductor layer 30 can be from 50 nanometers to 10 microns, although lesser and greater thicknesses can also be employed.

At least one first semiconductor device 32 is formed on the top surface of the first top semiconductor layer 30, which includes a semiconductor material. The at least one first semiconductor device 32 can be, for example, a field effect transistor, a bipolar transistor, a thyristor, a varactor, a diode, an electrical fuse, or any other type of semiconductor device known in the art. The upper side of the first substrate 2 is herein referred to as a front side, and the lower side of the first substrate 2 is herein referred to as a back side of the first substrate 2.

A first interconnect dielectric layer 40 can be formed over the at least one first semiconductor device 32 on the front side of the first top semiconductor layer 30. The first interconnect dielectric layer 40 can be composed of a dielectric material such as silicon oxide, silicon nitride, organosilicate glass (OSG), or any other dielectric material employed for constructing a metal interconnect layer in the art. The first interconnect dielectric layer 40 can be a single layer of homogeneous dielectric materials, or can be a plurality of layers having different compositions. At least one first metal interconnect structure 42 is formed in the first interconnect dielectric layer 40. Each of the at least one first metal interconnect structure 42 can be a conductive via structure, a conductive line structure, or a combination of at least one conductive via structure and at least one conductive line structure that are electrically connected among one another and electrically connected to one of the at least one first semiconductor device 32. The at least one first metal interconnect structure 42 is embedded in the first interconnect dielectric layer 40. The thickness of the first interconnect dielectric layer 40 can be from 100 nm to 20 microns, although lesser and greater thicknesses can also be employed.

At least one trench 49 is formed in the first substrate 2 by methods known in the art. For example, the at least one trench 49 can be formed by a combination of lithographic patterning of an etch mask (not shown) and an anisotropic etch during which the at least one trench 49 is formed in area(s) of opening in the etch mask. The at least one trench 49 can be a plurality of trenches 49. The at least one trench 49 extends from the topmost surface of the first substrate 2 to a depth within the first handle substrate 10. The lateral dimensions of each of the at least one trench 49 can be from 0.5 micron to 10 microns, although lesser and greater lateral dimensions can also be employed. Typically, the depth of the at least one trench 49 from the topmost surface of the first substrate 2 can be from 30 micron to 600 microns, although lesser and greater depths can also be employed.

Figure 2:
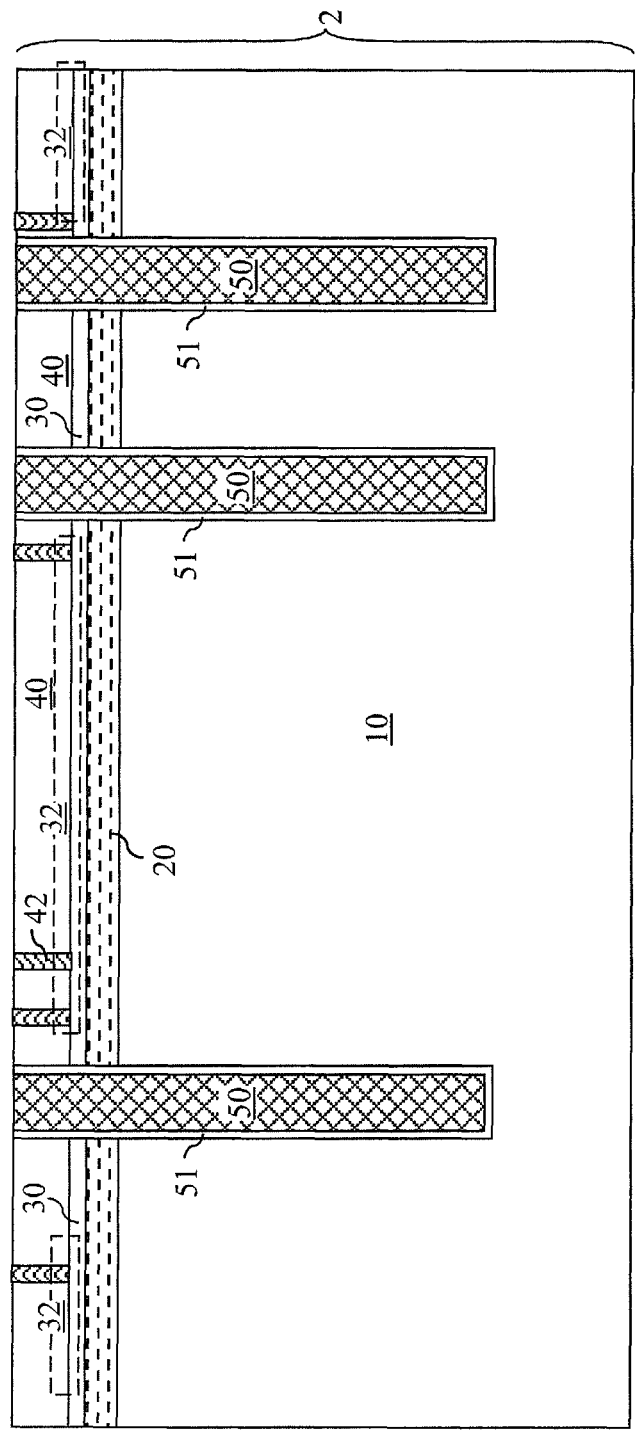

Referring to FIG. 2, a dielectric material layer and a conductive fill material are sequentially deposited in each of the at least one trench 49 and planarized to remove excess materials above the topmost surface of the first interconnect dielectric layer 40. Remaining portions of the dielectric material layer constitute at least one through-substrate via (TSV) liner 51, which contacts all sidewalls and bottom surfaces of the at least one trench 49.

The at least one TSV liner 51 is composed of a dielectric material such as silicon oxide, silicon nitride, or any other dielectric material. The at least one TSV liner 51 can be formed as a substantially conformal structure having substantially the same thickness throughout. The thickness of each of the at least one TSV liner 51 can be from 10 nm to 500 nm, although lesser and greater thicknesses can also be employed.

A through-substrate via (TSV) structure 50 is formed within each TSV liner 51. The at least one TSV structure 50 can be a plurality of TSV structures 50. The at least one TSV structure 50 is composed of a conductive material, which can be an elemental metal, an intermetallic alloy, a conductive metal nitride, a doped semiconductor material, or a combination thereof. In one embodiment, the at least one TSV structure 50 is composed of W, Au, Ag, Cu, Ni, or an alloy thereof.

Figure 3:
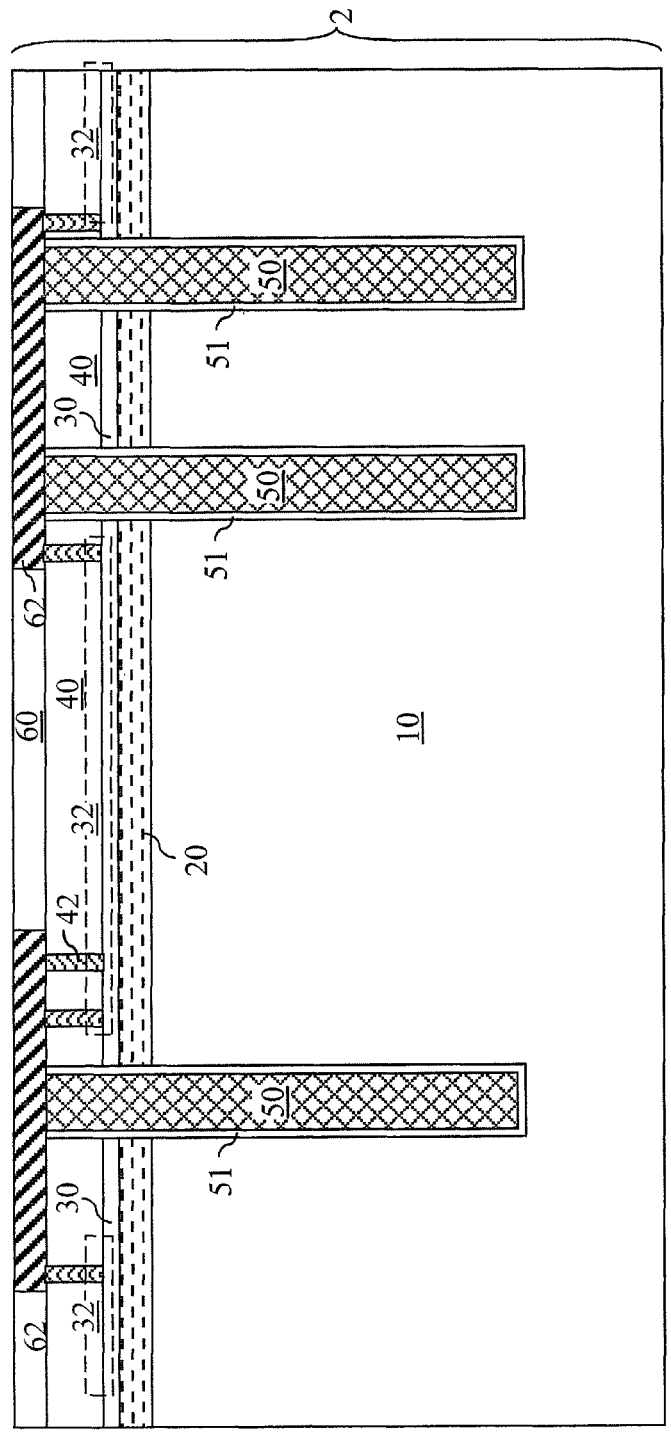

Referring to FIG. 3, a first front side dielectric layer 60 is formed on the first interconnect dielectric layer 40. The first front side dielectric layer 60 is composed of a dielectric material such as silicon oxide, silicon nitride, silicon oxynitride, or a combination thereof. First front side metal pads 62 are formed in the first front side dielectric layer 60 such that each of the first front side metal pads 62 is electrically connected to at least one of the at least one TSV structure 50. Further, the first front side metal pads 62 can be electrically connected to at least one of the at least one first metal interconnect structure 42. The first front side metal pads 62 are embedded in the first front side dielectric layer 60. The thickness of the first front side dielectric layer 60 can be from 0.2 micron to 10 microns, although lesser and greater thicknesses can also be employed.

Figure 4:
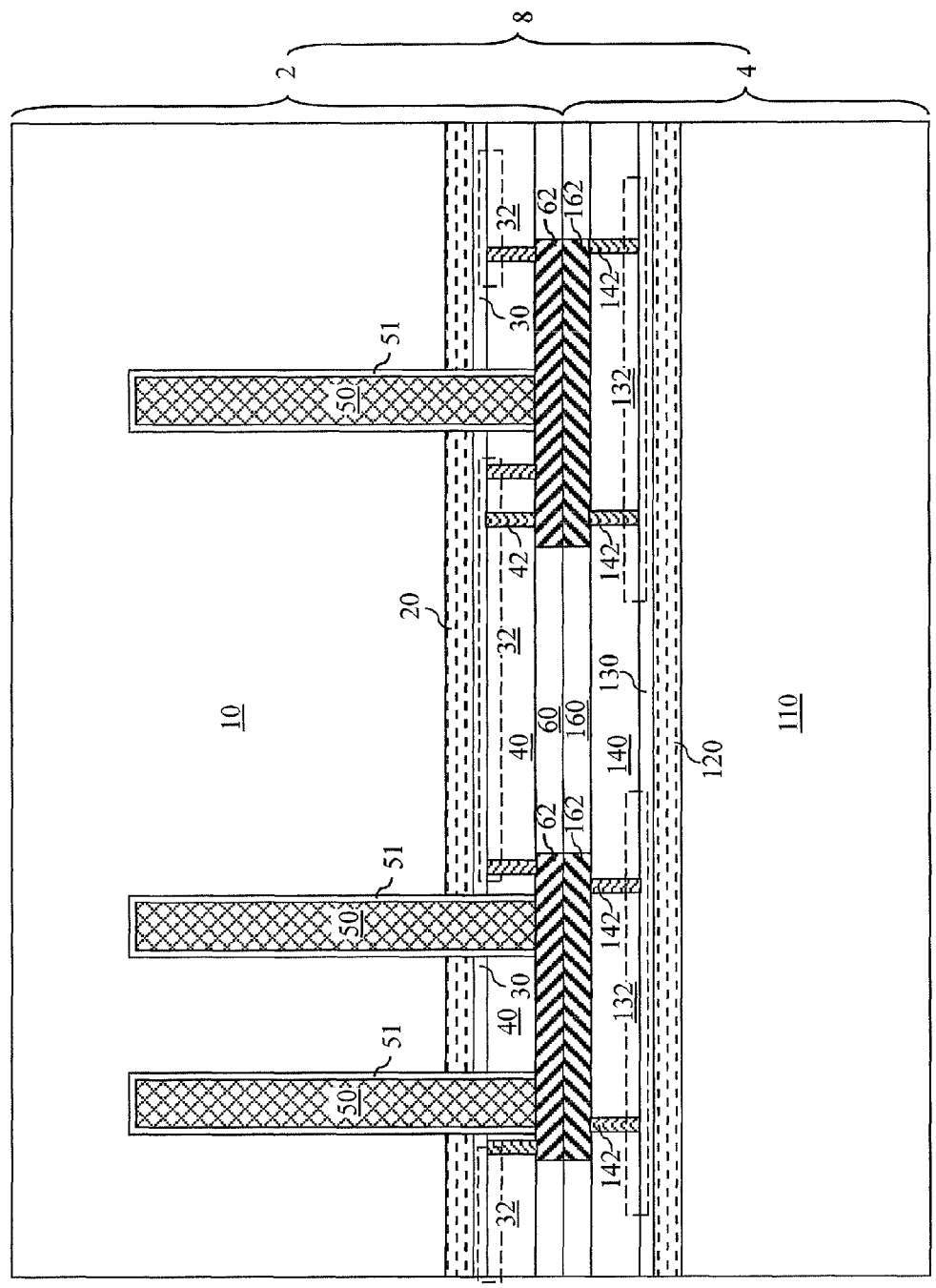

Referring to FIG. 4, the first substrate 2 can be flipped upside down and a second substrate 4 is bonded to the first substrate 2 by methods known in the art. The first substrate 2 and the second substrate 4 collectively constitute a bonded substrate 8. The front side of the first substrate 2 is bonded to the front side or the back side of the second substrate 4. For example, if the front side of the first substrate 2 is bonded to the front side of the second substrate 4, the second substrate 4 includes second front side metal pads 162 that are embedded in a second front side dielectric layer 160. In this case, the second front side metal pads 162 in the second substrate 4 are bonded to the first front side metal pads 62 in the first substrate 2.

The second substrate 4 can include a semiconductor-on-insulator (SOI) substrate, a bulk semiconductor substrate, or a hybrid substrate including at least one SOI portion and at least one bulk portion. If the second substrate 4 includes an SOI substrate, the SOI substrate can contain, from bottom to top, a second handle substrate 110, a second buried insulator layer 120, and a second top semiconductor layer 130.

The second handle substrate 110 can include a semiconductor material, a dielectric material, a conductive material, or a combination thereof. The second buried insulator layer 120 includes a dielectric material. The second top semiconductor layer 130 is composed of a semiconductor material that can be employed for the first top semiconductor layer 30 as described above. The thickness of the second top semiconductor layer 130 can be from 50 nanometers to 10 microns, although lesser and greater thicknesses can also be employed.

At least one second semiconductor device 132 is present on the top surface of the second top semiconductor layer 130. A second interconnect dielectric layer 140 can be present over the at least one second semiconductor device 132 on the front side of the second top semiconductor layer 130. The second interconnect dielectric layer 140 can be composed of any dielectric material that can be employed for the first interconnect dielectric layer 40 as described above. At least one second metal interconnect structure 142 is formed in the second interconnect dielectric layer 140. Each of the at least one second metal interconnect structure 142 can be a conductive via structure, a conductive line structure, or a combination of at least one conductive via structure and at least one conductive line structure that are electrically connected among one another and electrically connected to one of the at least one second semiconductor device 132. The at least one second metal interconnect structure 142 is embedded in the second interconnect dielectric layer 140. The thickness of the second interconnect dielectric layer 140 can be from 100 nm to 20 microns, although lesser and greater thicknesses can also be employed.

If the back side of the second substrate 4 is bonded to the front side of the first substrate 2, through-substrate via (TSV) structures (not shown) in the second substrate 4 can be employed to provide electrical connection between the first front side metal pads 62 in the first substrate 2 and the semiconductor devices located on the front side of the second substrate 4.

Figure 5:
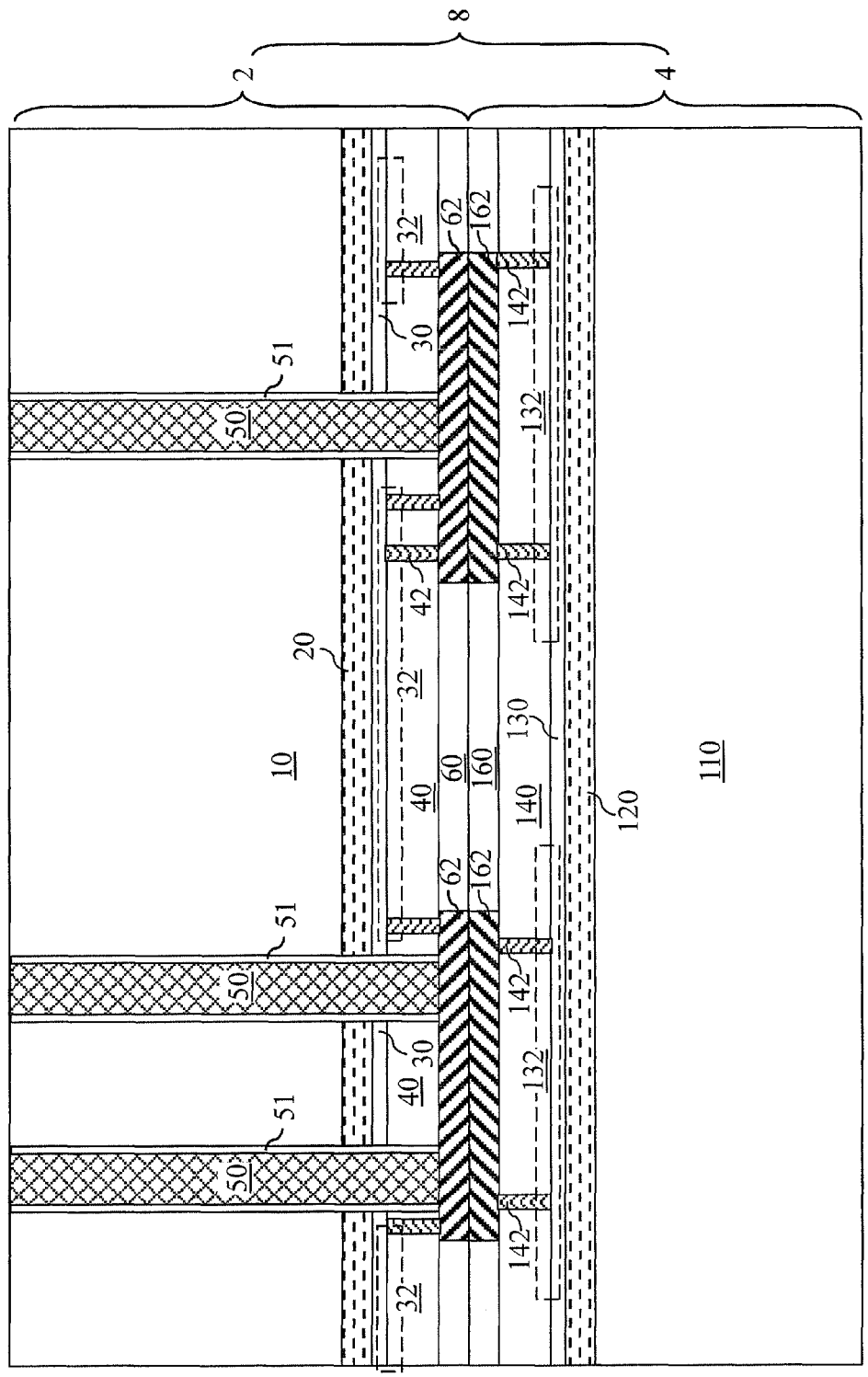

Referring to FIG. 5, the back side surface (which is the upper surface after the flipping) of the first substrate 2 is recessed to expose horizontal end surfaces of the at least one TSV structure 50. The horizontal end surfaces of the at least one TSV structure 50 are the bottommost surfaces of the at least one TSV structure 50 prior to flipping the first substrate 2 upside down. The recessing of the back side surface of the first substrate 2 can be effected, for example, by chemical mechanical planarization (CMP), mechanical grinding, dry etching, or a combination thereof. Because the horizontal portion of each of the at least one TSV liner 51 is removed, the at least one TSV liner 51 becomes a cylindrical structure that is topologically homeomorphic to a torus, i.e., a structure that can be continuously stretched into a shape of a torus without forming a new spatial singularity or destroying an existing spatial singularity. In one embodiment, the recessing of the back side surface of the first substrate 2 is performed such that the exposed end surfaces of the at least one TSV structure 50 and the at least one TSV liner 51 are coplanar with the back side surface of the first handle substrate 10 at the end of the recessing.

Figure 6:
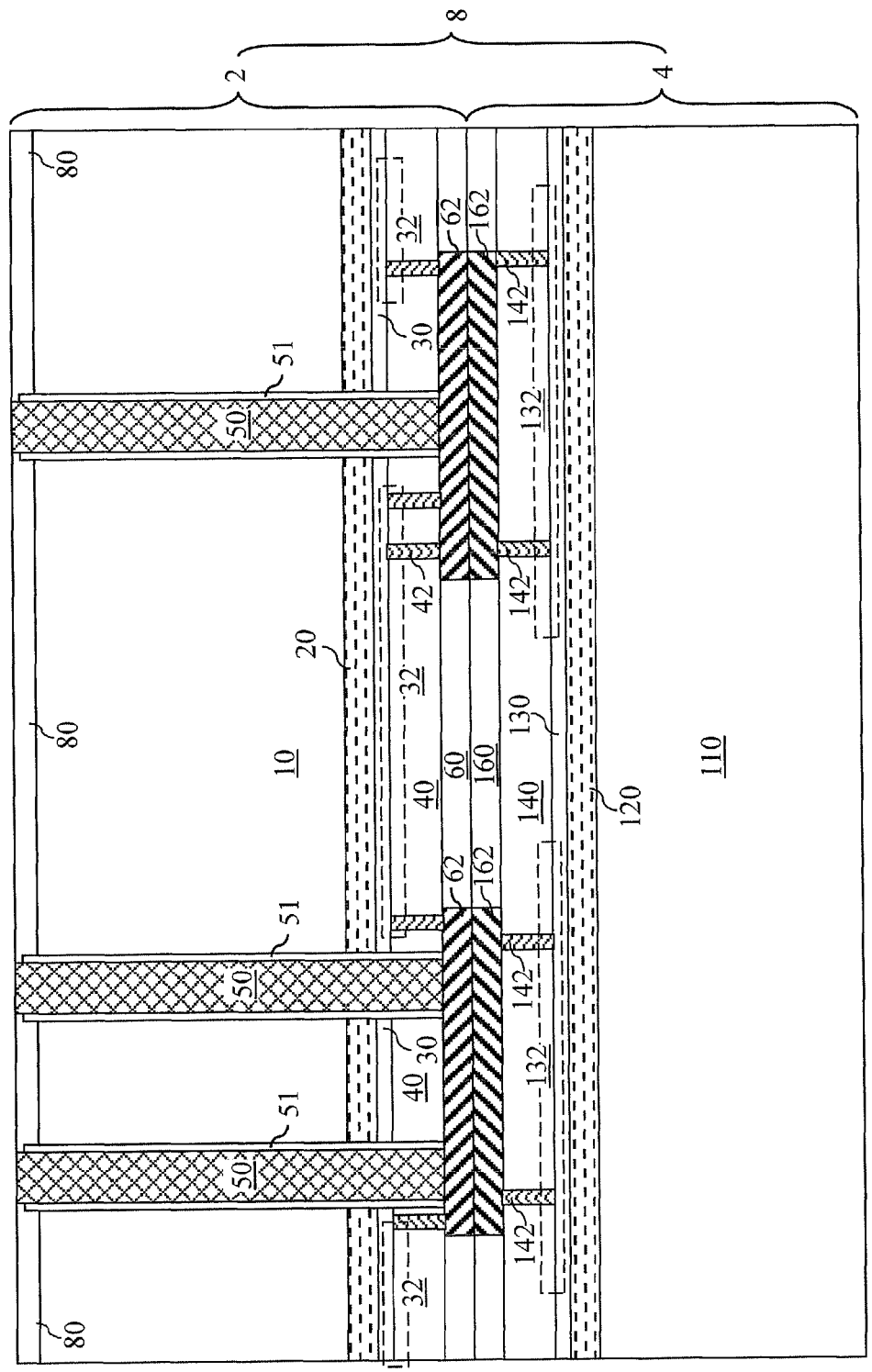

Referring to FIG. 6, optionally, the recessing of the back side surface of the first substrate 2 can be performed such that the exposed end surfaces of the at least one TSV structure 50 and the at least one TSV liner 51 protrude above the back side surface of the first handle substrate 10 at the end of the recessing. In this case, an optional planarization dielectric layer 80 can be deposited and planarized so that the exposed surface of the optional planarization dielectric layer 80 is coplanar with the exposed end surfaces of the at least one TSV structure 50 and the at least one TSV liner 51.

Figure 7:
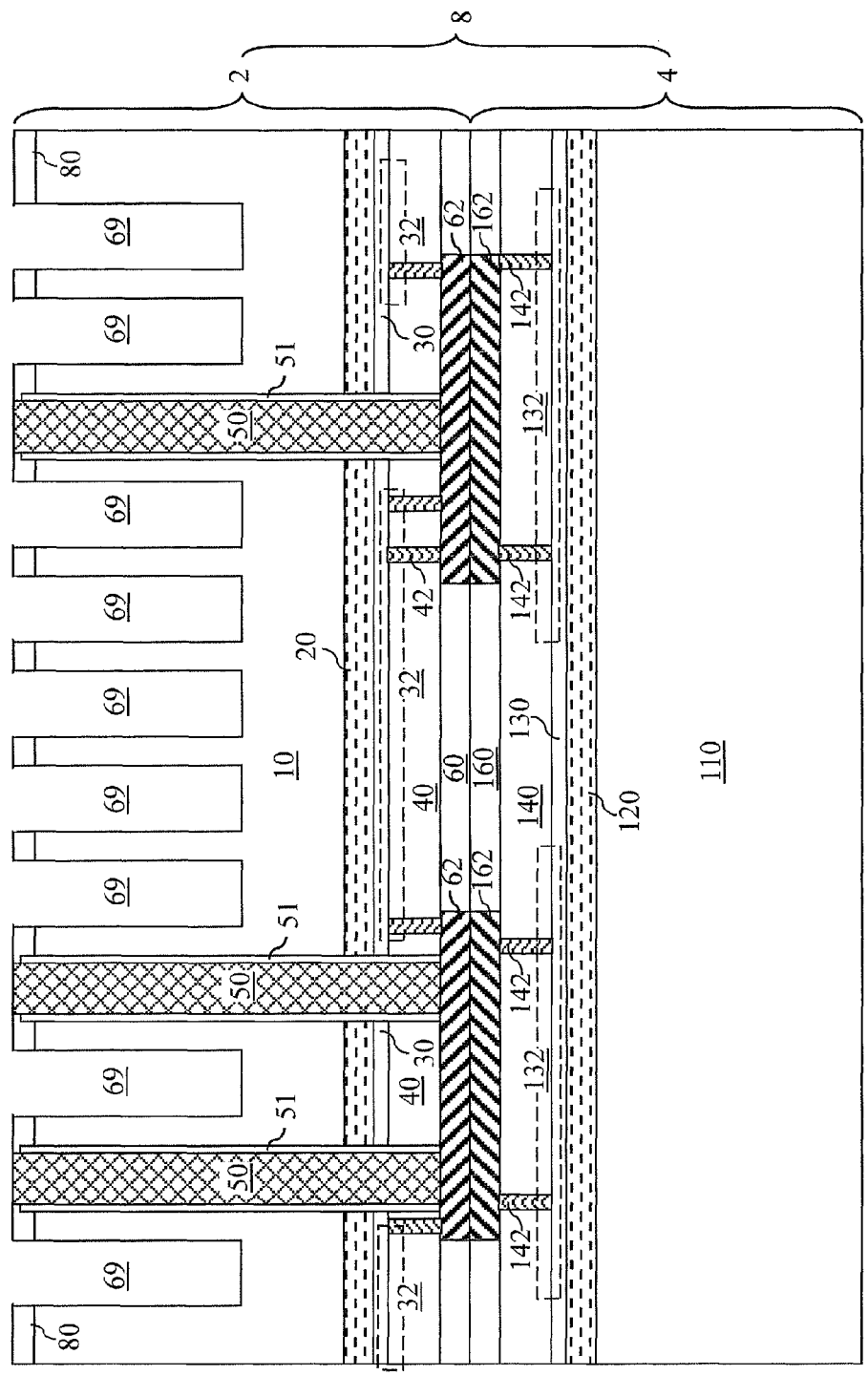

Referring to FIG. 7, at least one trench 69 is formed from the back side surface of the first substrate 2. Specifically, the at least one trench 69 extends from the back side surface of the first substrate 2 into the first substrate 2 to a depth. The vertical distance between the back side surface of the first substrate 2 and the bottom surfaces of the at least one trench 69 is herein referred to as a trench depth. In one embodiment, the trench depth is between 10% and 90% of the thickness of the SOI substrate (80, 10, 20, 30). The thickness of the SOI substrate (80, 10, 20, 30) is the vertical distance between the back side surface of the first substrate 2 and the interface between the first top semiconductor layer 30 and the first interconnect dielectric layer 40.

The lateral dimensions of the at least one trench 69 can be from 0.5 micron to 10 microns, and typically from 1 micron to 5 microns, although lesser and greater lateral dimensions can also be employed. The vertical cross-sectional profile of each of the at least one trench 69 can be substantially vertical so that the horizontal cross-sectional area of each of the at least one trench 69 is independent of the height at which the horizontal cross-sectional area is measured. Alternately, the vertical cross-sectional profile of each of the at least one trench 69 can have an inward taper such that the horizontal cross-sectional area of each of the at least one trench 69 decreases with the distance between the plane of the horizontal cross-section and the back side surface of the first substrate 2, e.g., the exposed surface of the optional planarization dielectric layer 80. Thus, each of the at least one trench 69 has a horizontal cross-sectional area that decreases with distance from the back side surface of the first substrate 2, or is substantially constant with distance from the back side surface of the first substrate 2.

Figure 8:
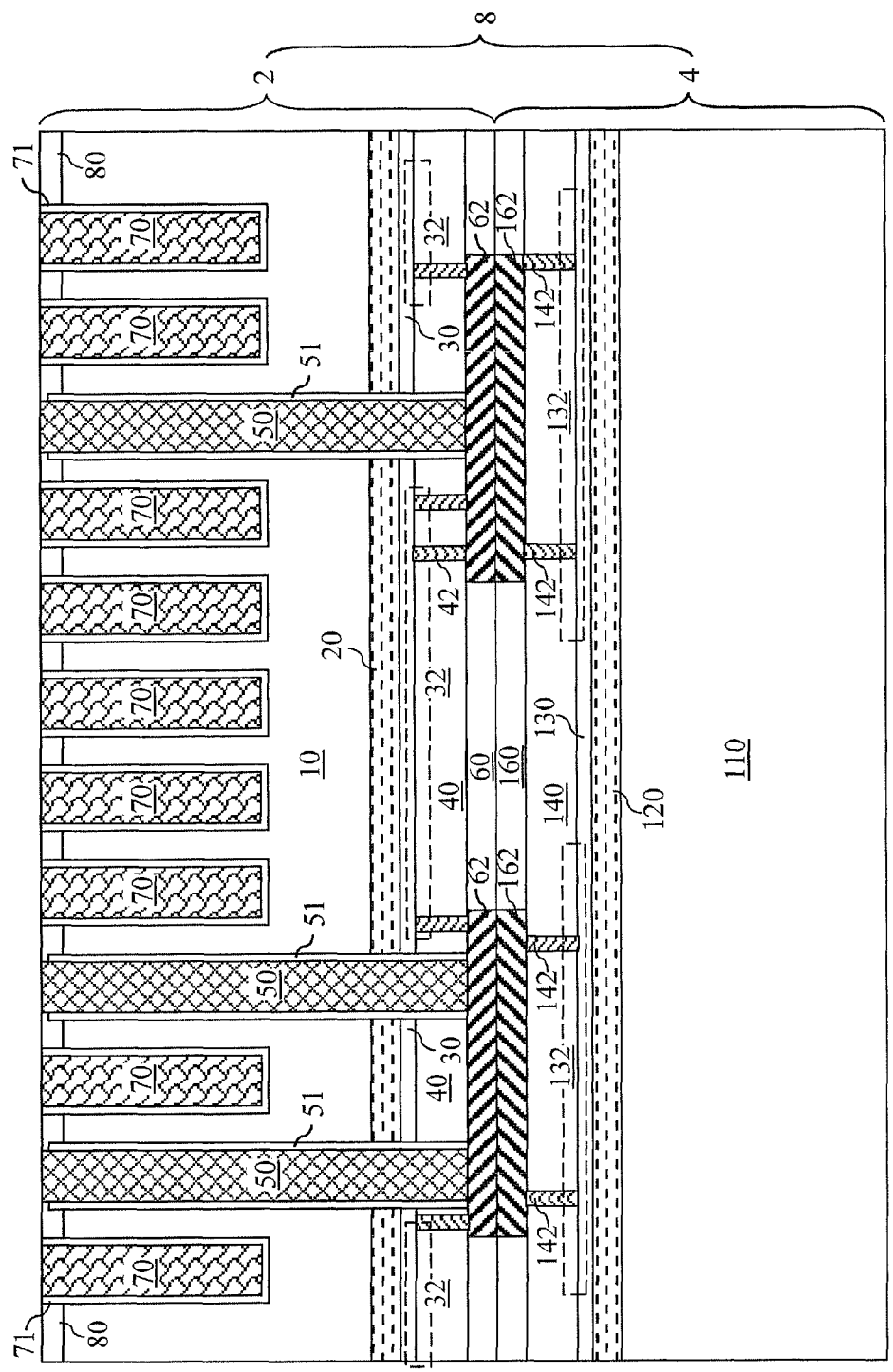

Referring to FIG. 8, an optional dielectric liner 71 can be formed in each of the at least one trench 69. The at least one optional dielectric liner 71 is optional, i.e., may or may not be present. The at least one optional dielectric liner 71, if present, can be composed of a dielectric material such as silicon oxide, silicon nitride, silicon oxynitride, or a combination thereof. The at least one optional dielectric liner 71 can have a thickness from 20 nm to 1 micron, and can be substantially conformal.

Any remaining volume in each of the at least one trench 69 is filled with a conductive material to form a conductive structure, which is herein referred to as a conductive backside dummy plug 70. For example, an optional dielectric material for the optional dielectric liner 71 and the conductive material are sequentially deposited to completely fill the at least one trench 69. The conductive fill material is selected from an elemental metal, an intermetallic alloy, a conductive metal nitride, a doped semiconductor material, and a combination thereof. For example, the conductive fill material can be selected from W, Au, Ag, Cu, Ni, or an alloy thereof. The conductive fill material for the at least one conductive backside dummy plug 70 can be the same as, or can be different from, the conductive material of the at least one TSV structure 50. Each of the at least one conductive backside dummy plug 70 can be completely filled with the conductive material.

Subsequently, the excess materials above the back side surface of the first substrate 2, e.g., the exposed surface of the optional planarization dielectric layer 80, are removed by planarization. The planarization can be effected, for example, by chemical mechanical planarization, a recess etch, or a combination thereof. After the planarization, the remaining portions of the optional dielectric material constitute the at least one optional dielectric liner 71. The remaining portions of the conductive material constitute the at least one conductive backside dummy plug 70. The at least one conductive backside dummy plug 70 can be a plurality of conductive backside dummy plugs 70 that are arranged in an array. The array may be periodic or non-periodic. An end surface of each of the at least one TSV structure 50 and surfaces of the at least one conductive backside dummy plug 70 are coplanar with the back side surface of the first substrate 2 after removing the portion of the fill material above the back side surface of the first substrate 2.

The at least one conductive backside dummy plug 70 extends from the back side surface of the first substrate 2 to a depth into the first substrate 2. This depth is substantially the same as the trench depth. The depth is less than the vertical distance between the front side surface and the back side surface of the SOI substrate (80, 10, 20, 30). If the trench depth is between 10% and 90% of the thickness of the SOI substrate (80, 10, 20, 30), the vertical dimension of the at least one conductive backside dummy plug 70 is between 10% and 90% of the thickness of the SOI substrate (80, 10, 20, 30).

Each of the at least one TSV 50 is electrically isolated from the first substrate 2. The at least one conductive backside dummy plug 70 is embedded in the first handle substrate 10. If the at least one optional dielectric liner 71 is present, the at least one conductive backside dummy plug 70 is not electrically shorted to the first handle substrate 10. The first handle substrate 10 can be a semiconductor material layer composed of a semiconductor material. In this case, the at least one conductive backside dummy plug 70 is not electrically shorted to any portion of the semiconductor material layer.

The first substrate 2 includes a semiconductor layer, which is the first top semiconductor layer 30, and the first interconnect dielectric layer 40. The at least one semiconductor device 32 is located at an interface between the semiconductor layer and the first interconnect dielectric layer 40. At least one TSV structure 50 is embedded in the first substrate 2. The at least one TSV structure 50 includes a conductive material and extends at least from the interface to the back side surface of the first substrate 2, which is the outer surface of the optional planarization dielectric layer 80. At least one conductive backside dummy plug 70 is embedded in the first substrate 2. The at least one conductive backside dummy plug 70 extends from the back side surface of the first substrate 2 to a depth into the first substrate 2. The depth is less than the vertical distance between the back side surface and the interface between the semiconductor layer and the first interconnect dielectric layer 40. The second substrate 4 is bonded to the front side surface of the first substrate 2. The first substrate 2 includes at least one first bonding pad 62 that is located on the front side of the first substrate 2 and bonded to at least one second bonding pad 162, which is are located on the second substrate 4. Each of the at least one TSV structure 50 can be electrically shorted to a first bonding pad 62 and a second bonding pad 162.

Figure 9:
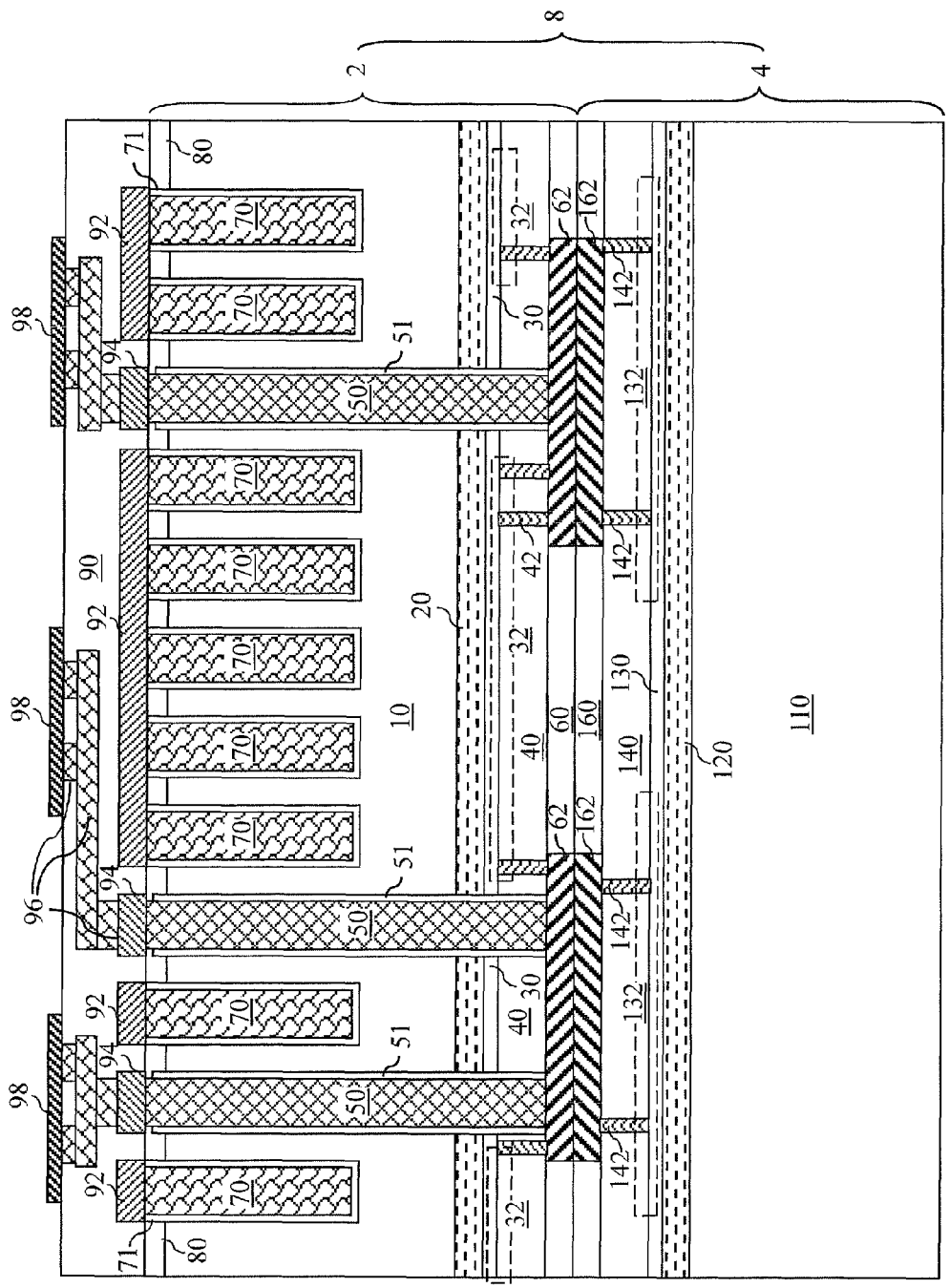

Referring to FIG. 9, metal lines can be formed on the back side surface of the first substrate 2. The metal lines can include first metal lines that are electrically connected to each of the at least one TSV structure 50. These first metal lines are herein referred to as first C4-wiring lines 94. The metal lines can include second metal lines that are electrically connected to the at least one conductive backside dummy plug 70. The second metal lines are herein referred to as second C4-wiring lines 92.

At least one C4-level dielectric layer 90 is formed over the first C4-level wiring lines 94 and the second C4-level wiring lines 92. C4-level metal interconnect structures 96 are formed within the at least one C4 level dielectric layer 90 as metal lines, metal vias, or a combination thereof. C4 pads 98 are formed on the at least one C4 level dielectric layer 90 and the C4-level metal interconnect structures 96 such that the C4 pads 98 are electrically connected to the at least one TSV structure 50. Each of the C4 pads 98 can be configured to be electrically connected to one of the at least one TSV structure 50. Optionally, some or all of the at least one conductive backside dummy plug 70 can be electrically connected to some of the C4 pads 98, which is subsequently electrically grounded or provided with a constant bias voltage such as a power supply voltage. Thus, the at least one conductive backside dummy plug 70 can be electrically floating without any electrical bias, can be electrically grounded through some of the C4 pads 98, or can be electrically biased with a constant voltage through some of the C4 pads 98. Variable signals are not provided to the at least one conductive backside dummy plug 70.

The first exemplary semiconductor structure of FIG. 9 improves vertical thermal conductivity within the first substrate 2 without requiring any active area in the first top semiconductor layer 30 because the at least one conductive backside dummy plug 70 accelerates heat transfer between the back side surface of the first substrate 2 and the interface between the first handle substrate 10 and the first buried insulator layer 20, while not extending into any portion of the first top semiconductor layer 30.

Further, the first exemplary semiconductor structure of FIG. 9 decouples signals between adjacent pairs of TSV structures 50 because the at least one conductive backside dummy plug 70 shields electrical signals from adjacent TSV structures 50. The effectiveness of the shielding of the electrical signals can be enhanced by grounding or tying to a constant voltage supply the at least one conductive backside dummy plug 70. The cross-talk between adjacent pairs of TSV structures 50 is reduced due to the large capacitance coupling between these TSV structures 50 to the at least one conductive backside dummy plug 70. Because the space occupied by the at least one conductive backside dummy plug 70 is limited within the first handle substrate 10, the presence of the at least one conductive backside dummy plug 70 does not adversely impact on the active area in the first top semiconductor layer 30.

Figure 10:
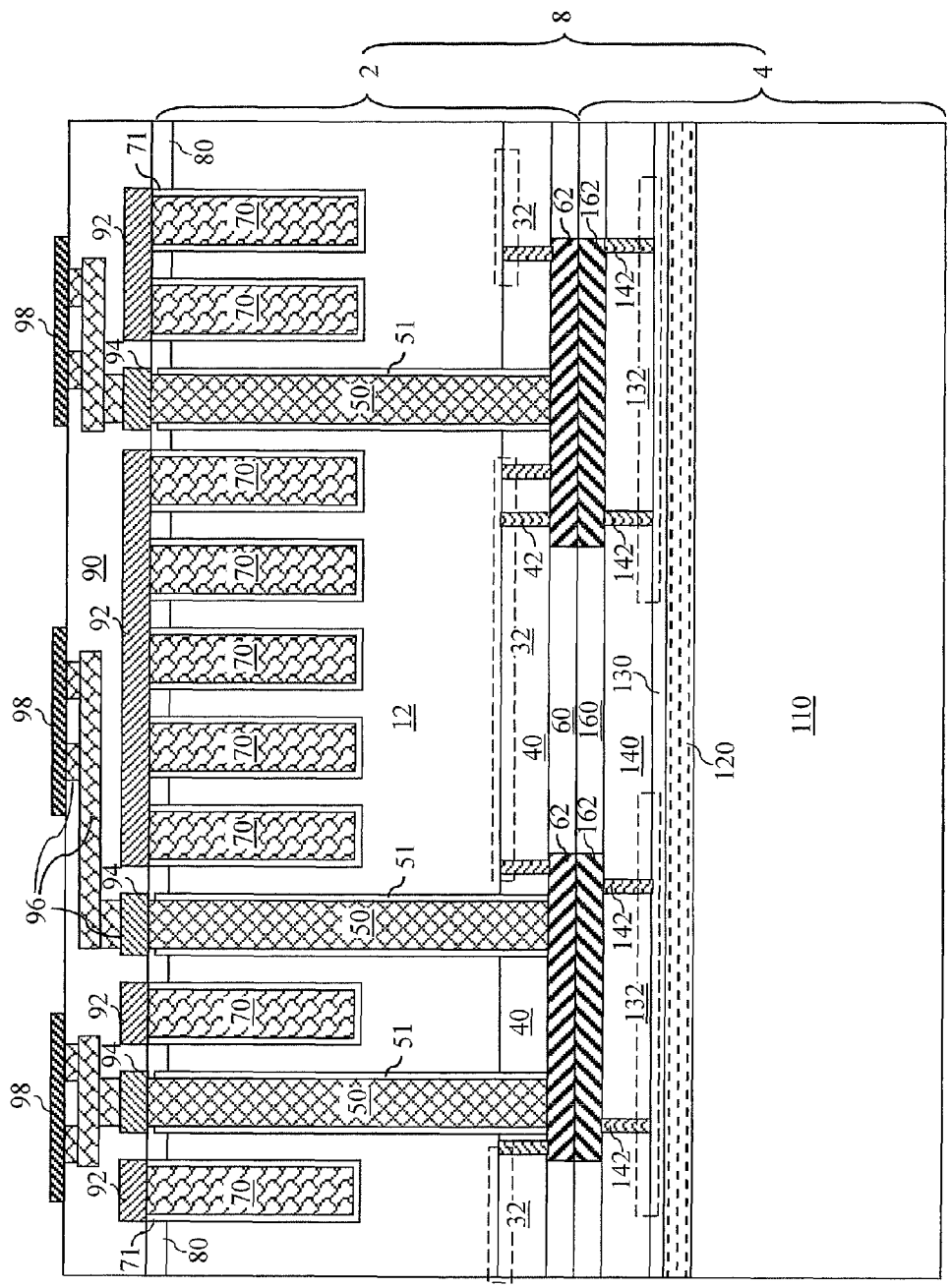
FIG. 10 is a vertical cross-sectional view of a variation of the first exemplary semiconductor structure according to the first embodiment of the present invention.

Referring to FIG. 10, a variation of the first exemplary semiconductor structure employs a bulk substrate 12 for the first substrate 2 instead of an SOI substrate (80, 10, 20, 30). The bulk substrate 12 can be composed of a single crystalline semiconductor material or a polycrystalline semiconductor material contiguously extending from the front side surface to the back side surface. The front side surface of the bulk substrate 12 is the interface between the bulk substrate 12 and the first interconnect dielectric layer 40.

Figure 11:
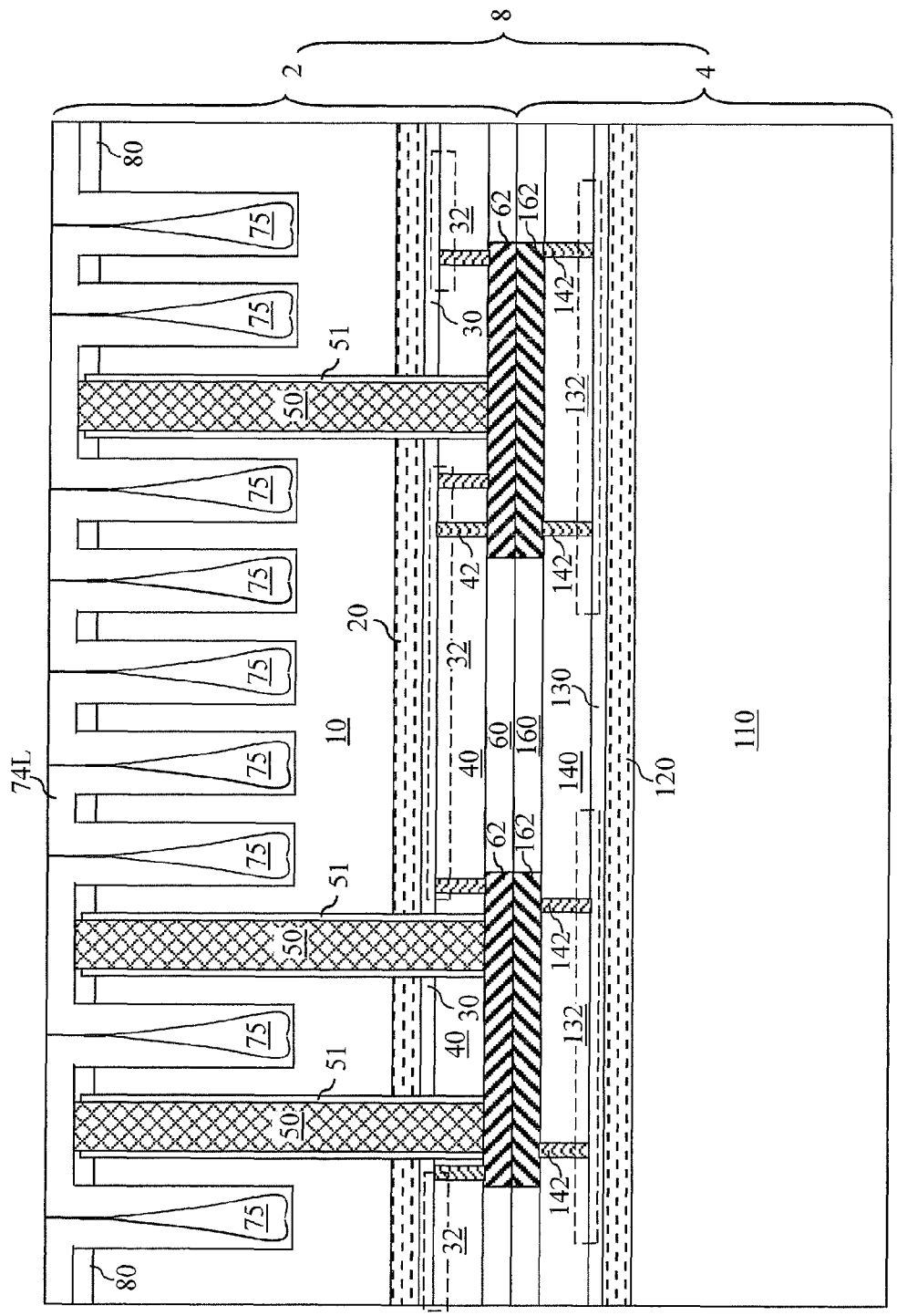
FIGS. 11-13 are sequential vertical cross-sectional views of a second exemplary semiconductor structure at various stages of a manufacturing process according to a second embodiment of the present invention.

Referring to FIG. 11, a second exemplary semiconductor structure according to a second embodiment of the present invention is derived from the first exemplary semiconductor structure in FIG. 7 by depositing a non-conformal dielectric material layer 74L. The thickness of the non-conformal dielectric material layer 74L is greater than one half of the lateral dimensions of the at least one trench 69. The thickness of the non-conformal dielectric material layer 74L is measured above the upper surface of the optional planarization dielectric layer 80 if the optional planarization dielectric layer 80 is present, or above the upper surface of the first handle substrate 10 if the optional planarization dielectric layer 80 is not present. Each of the at least one trench 69 in FIG. 7 is partially filled with the dielectric material of the non-conformal dielectric material layer 74L, thereby forming therein a cavity 75 surrounded by the dielectric material. Each of the at least one cavity 75 is sealed off by the dielectric material of the non-conformal dielectric material layer 74L. The non-conformal dielectric material layer 74L can be formed by any non-conformal deposition process that deposits a dielectric material. For example, the non-conformal dielectric material layer 74L can be deposited by plasma enhanced chemical vapor deposition (PECVD) or any other depletive chemical vapor deposition process.

Figure 12:
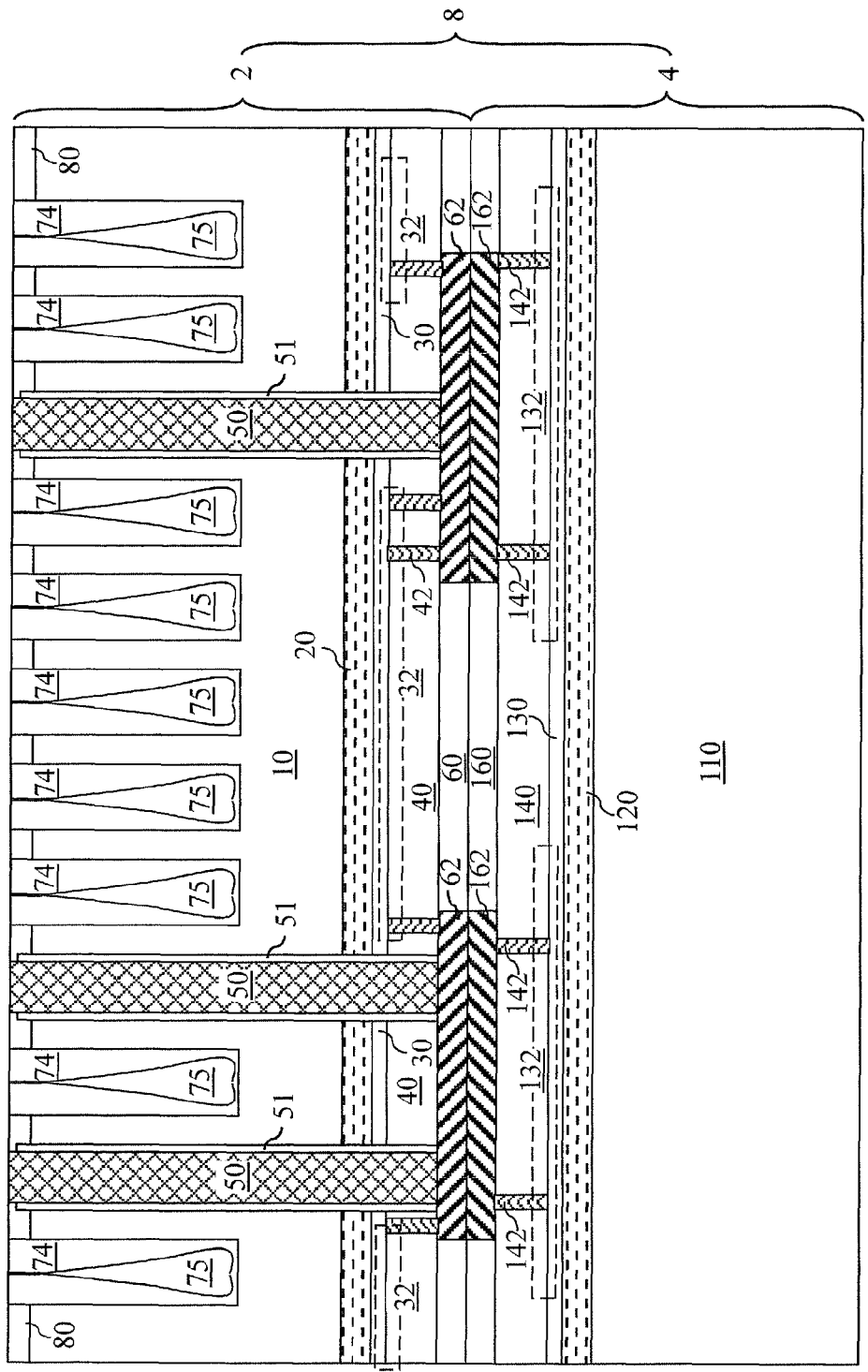

Referring to FIG. 12, the portion of the non-conformal dielectric material layer 74L above the upper surface of the optional planarization dielectric layer 80 is removed by planarization, which can be effected, for example, by chemical mechanical planarization (CMP), a recess etch, or a combination thereof. The remaining portions of the non-conformal dielectric material layer 74L constitute at least one dielectric backside dummy plug 74. Each of the at least one dielectric backside dummy plug 74 includes a cavity 75 therein. The top surfaces of the at least one dielectric backside dummy plug 74 is coplanar with the back side surface, i.e., the upper surface, of the first substrate 2 after planarization.

Figure 13:
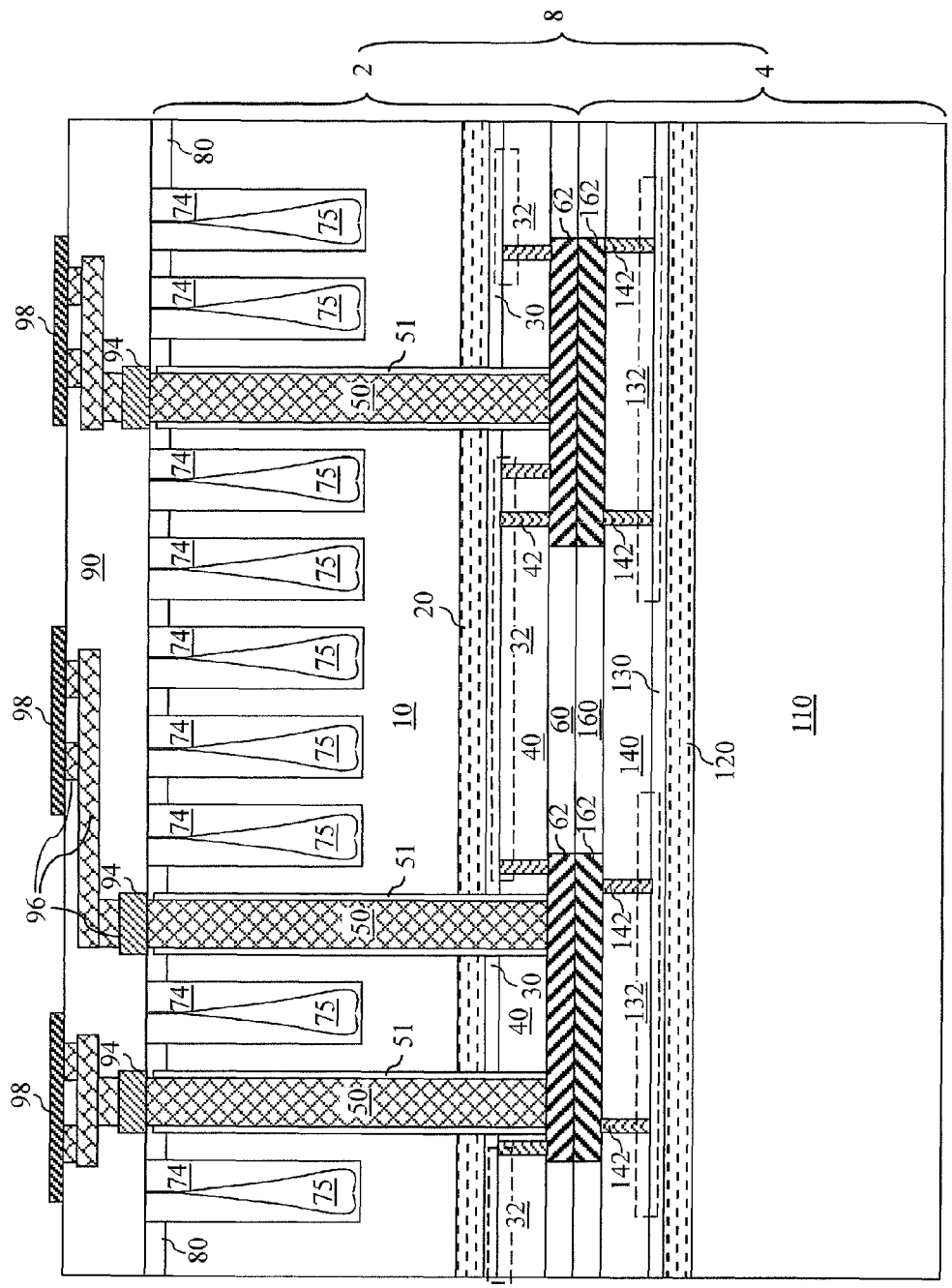

Referring to FIG. 13, first C4-wiring lines 94, at least one C4-level dielectric layer 90, C4-level metal interconnect structures 96, and C4 pads 98 can be formed in the same manner as in the first embodiment. Because the at least one dielectric backside dummy plug 74 is composed of a dielectric material, the at least one dielectric backside dummy plug 74 is not electrically biased.

The at least one dielectric backside dummy plug 74 extends from the back side surface of the first substrate 2 to a depth into the first substrate 2. This depth is substantially the same as the trench depth. The depth is less than the vertical distance between the front side surface and the back side surface of the SOI substrate (80, 10, 20, 30). If the trench depth is between 10% and 90% of the thickness of the SOI substrate (80, 10, 20, 30), the vertical dimension of the at least one dielectric backside dummy plug 74 is between 10% and 90% of the thickness of the SOI substrate (80, 10, 20, 30).

Each of the at least one TSV 50 is electrically isolated from the first substrate 2. The at least one dielectric backside dummy plug 74 is embedded in the first handle substrate 10. The at least one dielectric backside dummy plug 74 is not electrically shorted to the first handle substrate 10 because the at least one dielectric backside dummy plug 74 is composed of a dielectric material.

The first substrate 2 includes a semiconductor layer, which is the first top semiconductor layer 30, and the first interconnect dielectric layer 40. The at least one semiconductor device 32 is located at an interface between the semiconductor layer and the first interconnect dielectric layer 40. At least one TSV structure 50 is embedded in the first substrate 2. The at least one TSV structure 50 includes a conductive material and extends at least from the interface to the back side surface of the first substrate 2, which is the outer surface of the optional planarization dielectric layer 80. At least one dielectric backside dummy plug 74 is embedded in the first substrate 2. The at least one dielectric backside dummy plug 74 extends from the back side surface of the first substrate 2 to a depth into the first substrate 2. The depth is less than the vertical distance between the back side surface and the interface between the semiconductor layer and the first interconnect dielectric layer 40. The second substrate 4 is bonded to the front side surface of the first substrate 2. The first substrate 2 includes at least one first bonding pad 62 that are located on the front side of the first substrate 2 and bonded to at least one second bonding pad 162 that are located on the second substrate 4. Each of the at least one TSV structure 50 can be electrically shorted to a first bonding pad 62 and a second bonding pad 162.

At least one dielectric backside dummy plug 74 relieves mechanical stress in the first substrate 2. The mechanical stress in the first substrate 2 can be generated, for example, by a mismatch in the coefficients of thermal expansion (CTEs) between the materials of the first handle substrate 10, the first buried insulator layer 20, and the first top semiconductor layer 30 and the material of the at least one TSV structure 50. Preferably, the dielectric material of the at least one dielectric backside dummy plug 74 is a material that deforms easily upon application of stress. For example, the dielectric material of the at least one dielectric backside dummy plug 74 can be doped silicate glass. The dielectric material of the at least one dielectric backside dummy plug 74 accommodates volume changes of the components of the first substrate 2 during temperature cycling. For example, if the at least one TSV structure 50 expands during subsequent high-temperature processing, including thermocompression bonding steps, the material of the first handle substrate 10 has some available volume to expand into, thereby reducing the stress applied to the at least one TSV structure 50 and minimizing the probability of cracking of any structure within the first substrate 2.

Figure 14:
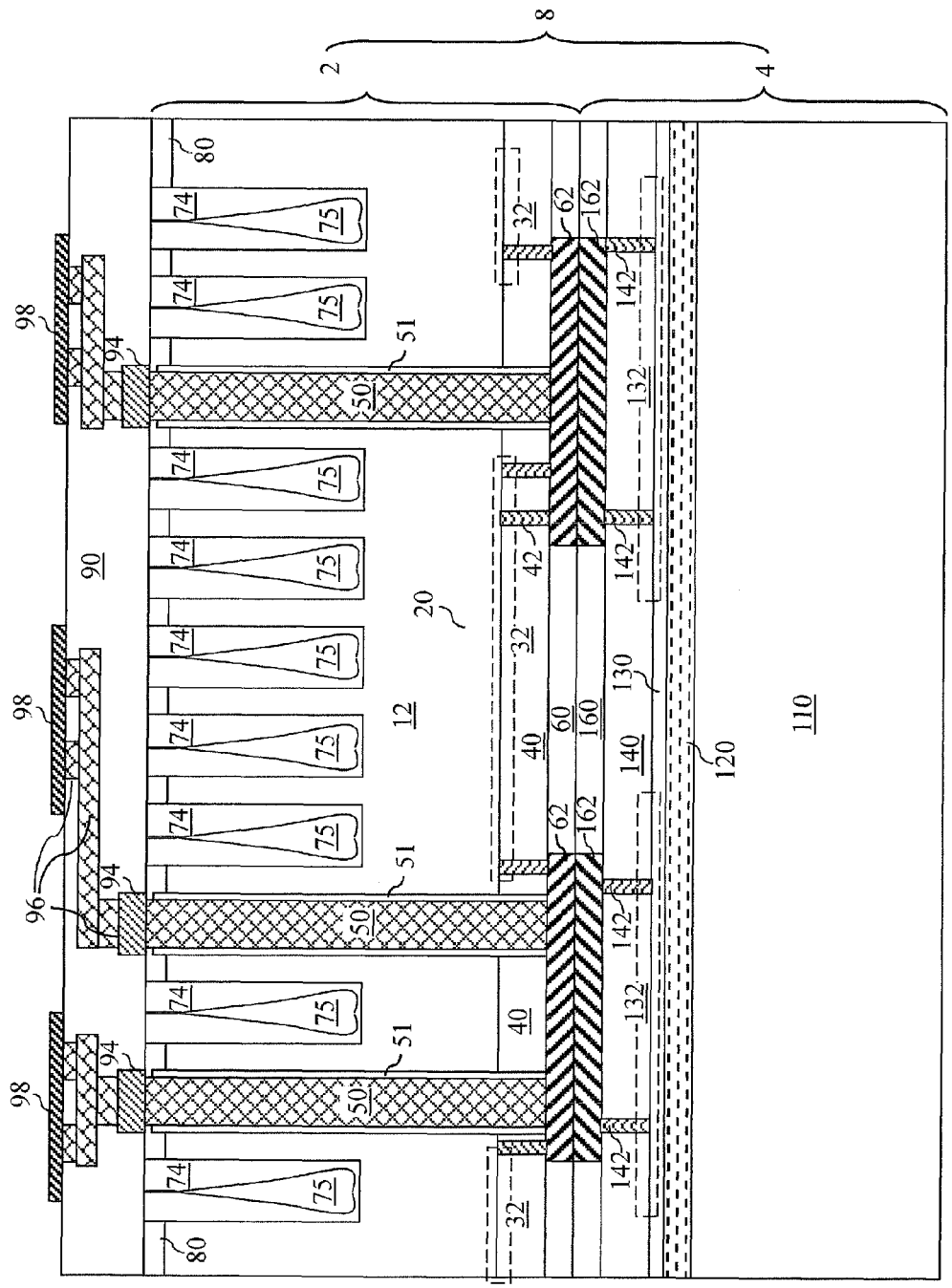
FIG. 14 is a vertical cross-sectional view of a variation of the second exemplary semiconductor structure according to the second embodiment of the present invention.

Referring to FIG. 14, a variation of the second exemplary semiconductor structure employs a bulk substrate 12 for the first substrate 2 instead of an SOI substrate (80, 10, 20, 30). The bulk substrate 12 can be composed of a single crystalline semiconductor material or a polycrystalline semiconductor material contiguously extending from the front side surface to the back side surface. The front side surface of the bulk substrate 12 is the interface between the bulk substrate 12 and the first interconnect dielectric layer 40.

Figure 15:
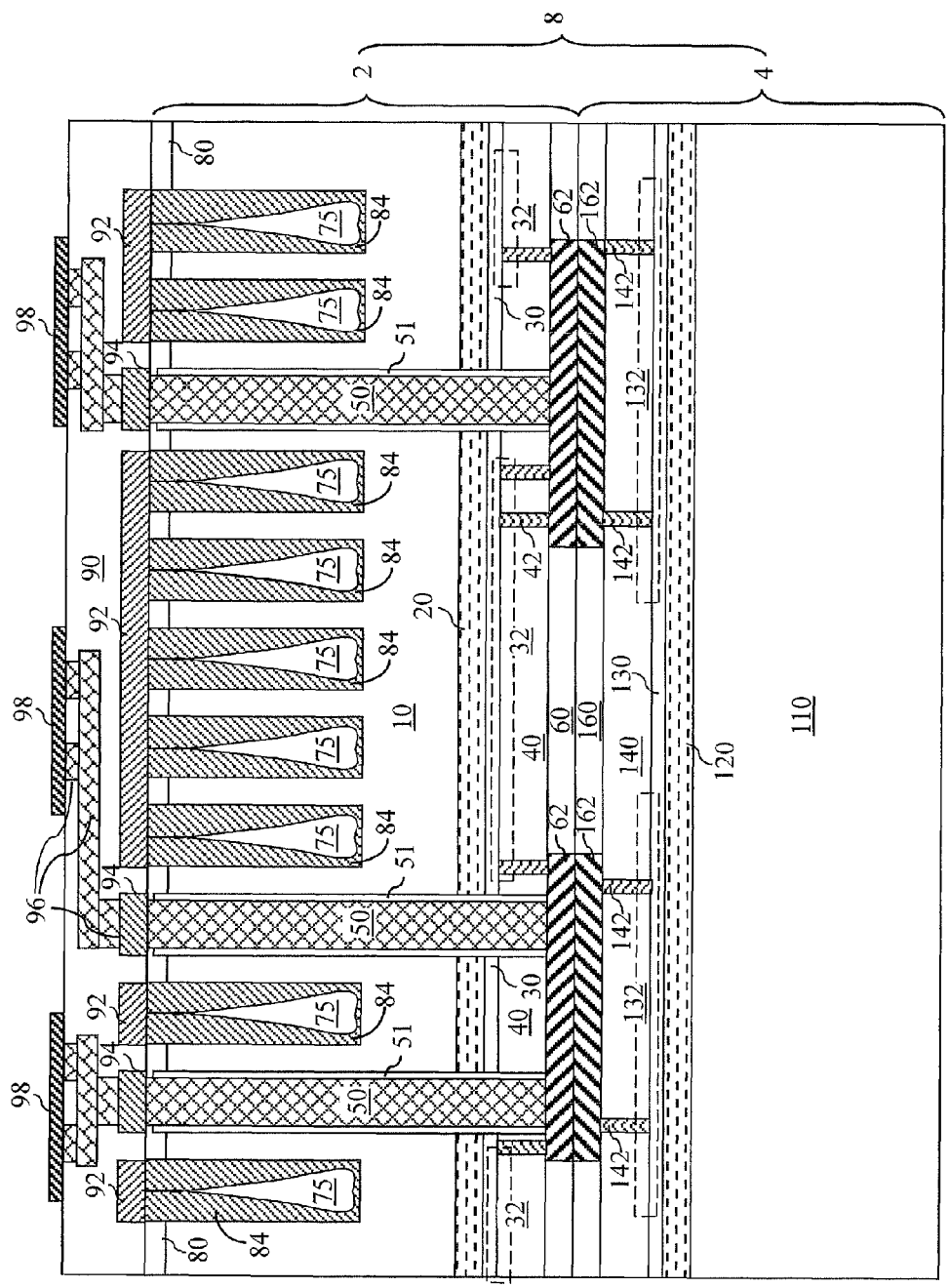
FIG. 15 is a vertical cross-sectional view of a third exemplary semiconductor structure according to a third embodiment of the present invention.

Referring to FIG. 15, a third exemplary semiconductor structure according to a third embodiment of the present invention is derived from the first exemplary semiconductor structure in FIG. 7 by depositing a non-conformal conductive material layer (not shown) instead of a non-conformal dielectric material layer 741, of FIG. 11. The thickness of the non-conformal conductive material layer is greater than one half of the lateral dimensions of the at least one trench 69. Each of the at least one trench 69 in FIG. 7 is partially filled with the conductive material of the non-conformal conductive material layer, thereby forming therein a cavity 75 surrounded by the conductive material. Each of the at least one cavity 75 is sealed off by the conductive material of the non-conformal conductive material layer. The non-conformal conductive material layer can be formed by any non-conformal deposition process that deposits a conductive material. For example, the non-conformal conductive material layer can be deposited by physical vapor deposition, non-conformal chemical vapor deposition, and/or non-conformal plating process.

The portion of the non-conformal conductive material layer above the upper surface of the optional planarization dielectric layer 80 is removed by planarization, which can be effected, for example, by chemical mechanical planarization (CMP), a recess etch, or a combination thereof. The remaining portions of the non-conformal conductive material layer constitute at least one conductive backside dummy plug 84. Each of the at least one conductive backside dummy plug 84 includes a cavity 75 therein. The top surfaces of the at least one conductive backside dummy plug 84 is coplanar with the back side surface, i.e., the upper surface, of the first substrate 2 after planarization.

First C4-wiring lines 94, second C4-wiring lines 92, at least one C4-level dielectric layer 90, C4-level metal interconnect structures 96, and C4 pads 98 can be formed in the same manner as in the first embodiment. Optionally, a dielectric liner (not shown) can be formed between each of the at least one conductive backside dummy plug 84 and the first handle substrate 10 to electrically isolate the at least one conductive backside dummy plug 84 from the first handle substrate 10.

The at least one conductive backside dummy plug 84 extends from the back side surface of the first substrate 2 to a depth into the first substrate 2. This depth is substantially the same as the trench depth. The depth is less than the vertical distance between the front side surface and the back side surface of the SOI substrate (80, 10, 20, 30). If the trench depth is between 10% and 90% of the thickness of the SOI substrate (80, 10, 20, 30), the vertical dimension of the at least one conductive backside dummy plug 84 is between 10% and 90% of the thickness of the SOI substrate (80, 10, 20, 30).

Each of the at least one TSV 50 is electrically isolated from the first substrate 2. The at least one conductive backside dummy plug 84 is embedded in the first handle substrate 10. The at least one conductive backside dummy plug 84 can be electrically isolated from the first handle substrate 10 if dielectric liners surrounding the at least one conductive backside dummy plug 84 are present.

The first substrate 2 includes a semiconductor layer, which is the first top semiconductor layer 30, and the first interconnect dielectric layer 40. The at least one semiconductor device 32 is located at an interface between the semiconductor layer and the first interconnect dielectric layer 40. At least one TSV structure 50 is embedded in the first substrate 2. The at least one TSV structure 50 includes a conductive material and extends at least from the interface to the back side surface of the first substrate 2, which is the outer surface of the optional planarization dielectric layer 80. At least one conductive backside dummy plug 84 is embedded in the first substrate 2. The at least one conductive backside dummy plug 84 extends from the back side surface of the first substrate 2 to a depth into the first substrate 2. The depth is less than the vertical distance between the back side surface and the interface between the semiconductor layer and the first interconnect dielectric layer 40. The second substrate 4 is bonded to the front side surface of the first substrate 1 The first substrate 2 includes at least one first bonding pad 62 that are located on the front side of the first substrate 2 and bonded to at least one second bonding pad 162 that are located on the second substrate 4. Each of the at least one TSV structure 50 can be electrically shorted to a first bonding pad 62 and a second bonding pad 162.

At least one conductive backside dummy plug 84 relieves mechanical stress in the first substrate 2. Preferably, the conductive material of the at least one conductive backside dummy plug 84 is a malleable material that deforms easily upon application of stress. For example, the conductive material of the at least one conductive backside dummy plug 84 can be Au, Ag, Cu, or W. The conductive material of the at least one conductive backside dummy plug 84 accommodates volume changes of the components of the first substrate 2 during temperature cycling.

Figure 16:
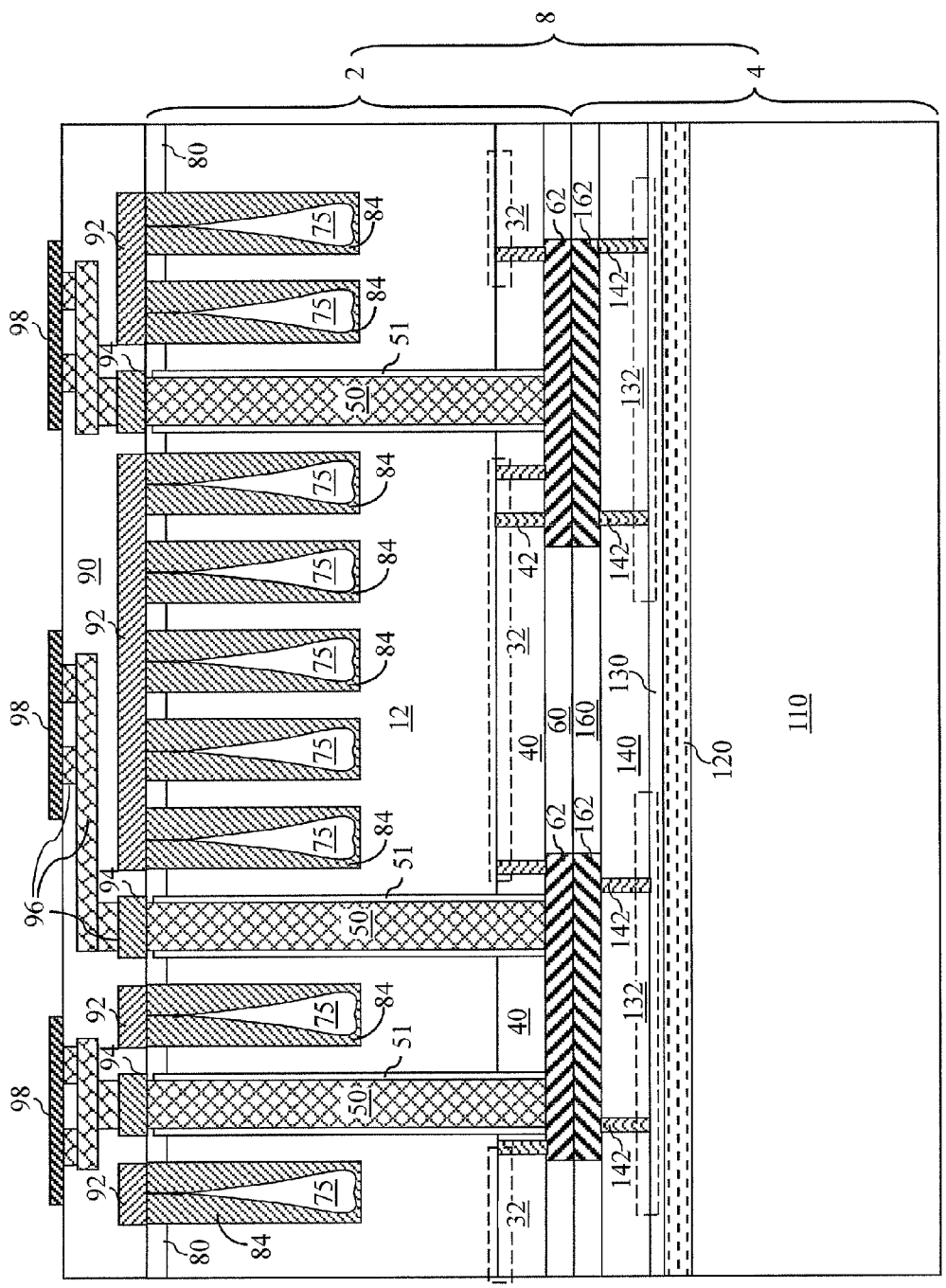
FIG. 16 is a vertical cross-sectional view of a variation of the third exemplary semiconductor structure according to the third embodiment of the present invention.

Referring to FIG. 16, a variation of the third exemplary semiconductor structure employs a bulk substrate 12 for the first substrate 2 instead of an SOI substrate (80, 10, 20, 30). The bulk substrate 12 can be composed of a single crystalline semiconductor material or a polycrystalline semiconductor material contiguously extending from the front side surface to the back side surface. The front side surface of the bulk substrate 12 is the interface between the bulk substrate 12 and the first interconnect dielectric layer 40.

Figure 17:
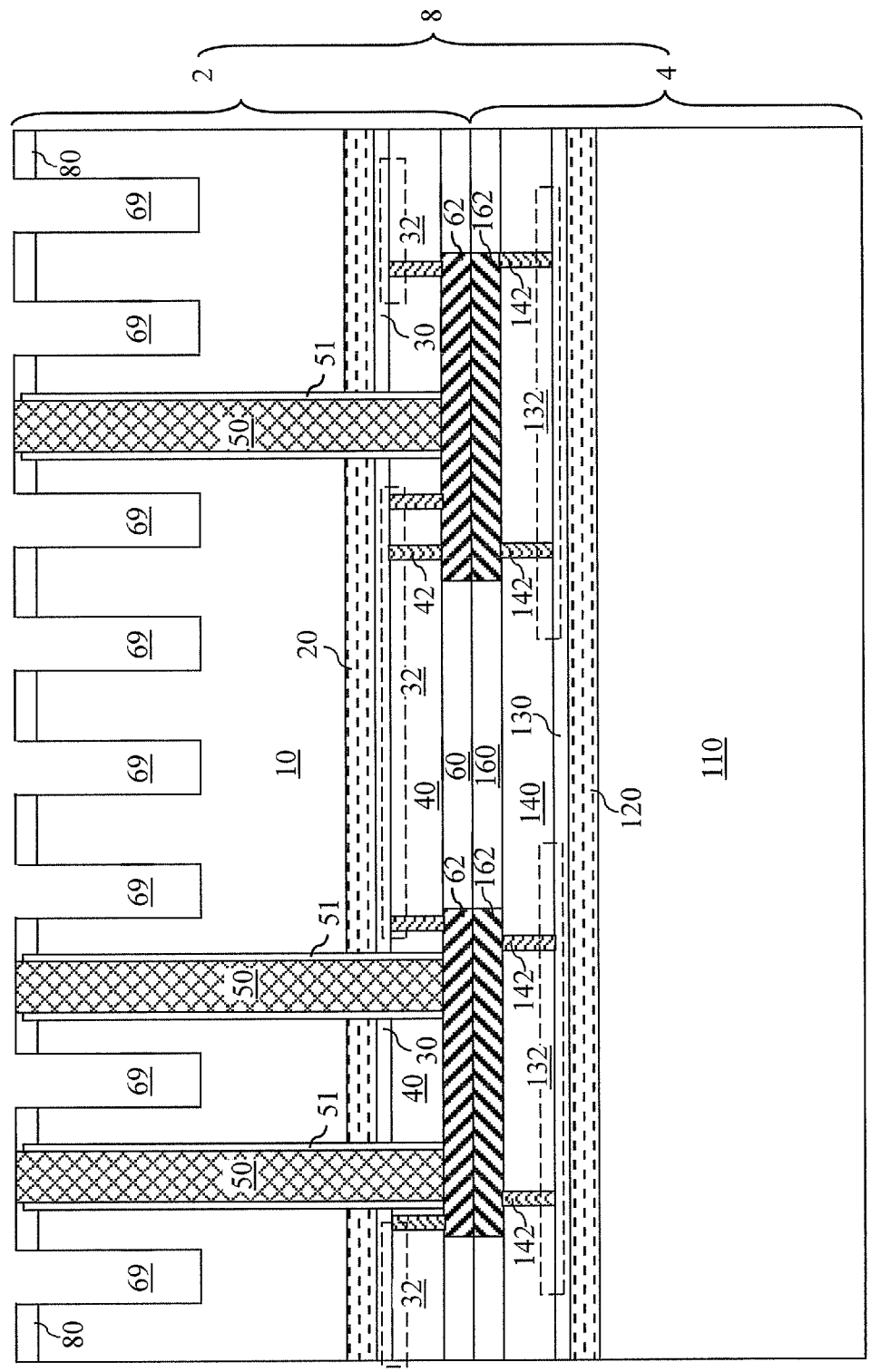
FIGS. 17-22 are sequential vertical cross-sectional view of a fourth exemplary semiconductor structure at various stages of a manufacturing process according to a fourth embodiment of the present invention.

Referring to FIG. 17, a fourth exemplary semiconductor structure according to a fourth embodiment of the present invention is derived from the first exemplary semiconductor structure of FIG. 6 by employing the same processing steps of FIG. 7. At least one trench 69 is formed on the back side surface of the first substrate 2.

Figure 18:
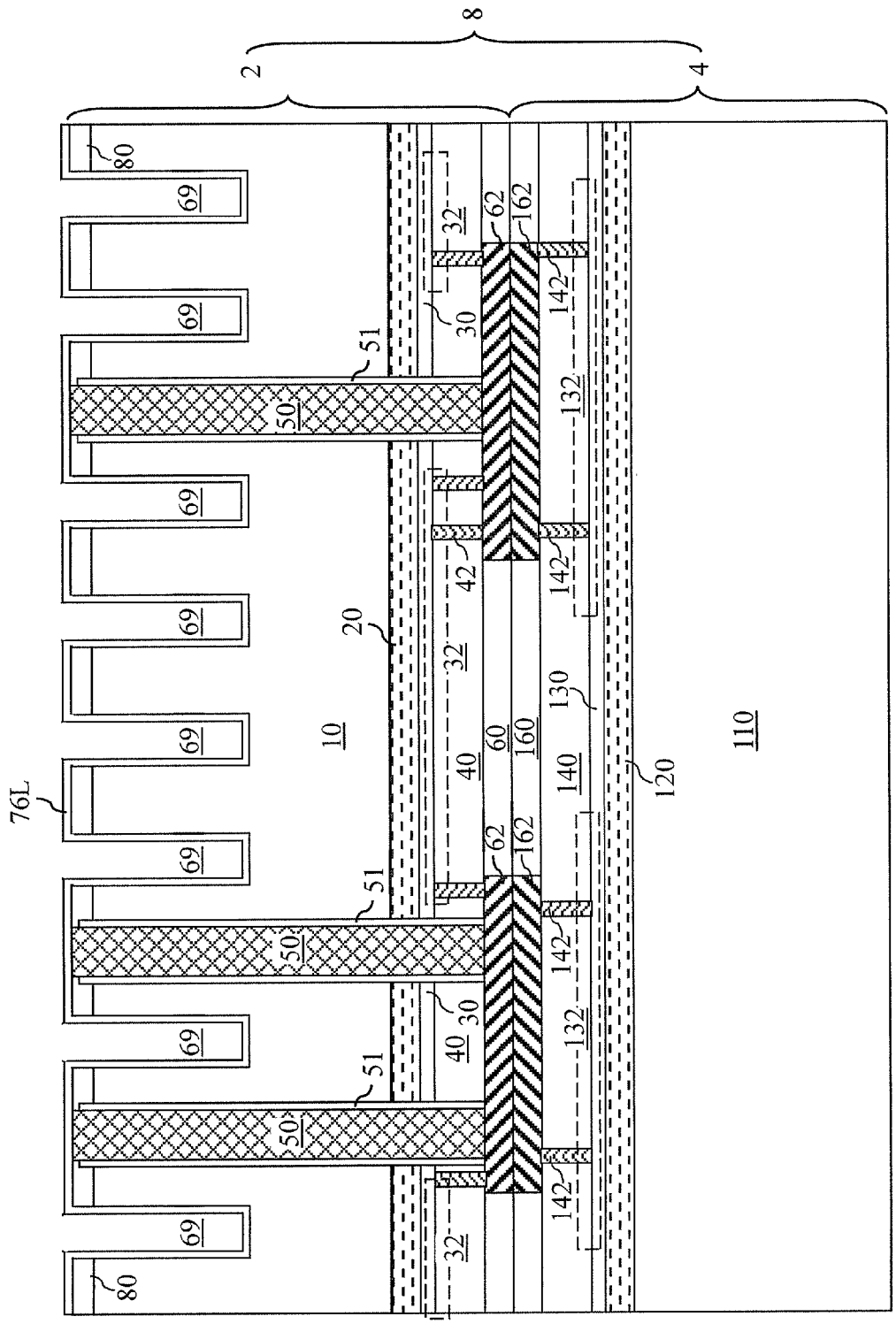

Referring to FIG. 18, a contiguous dielectric liner 76L is formed in each of the at least one trench 69 as a single contiguous layer. The contiguous dielectric liner 76L can be a conformal layer composed of a dielectric material such as silicon oxide, silicon nitride, silicon oxynitride, or a combination thereof. The thickness of the contiguous dielectric liner 76L can be from 20 nm to 1 micron, although lesser and greater thicknesses can also be employed.

Figure 19:
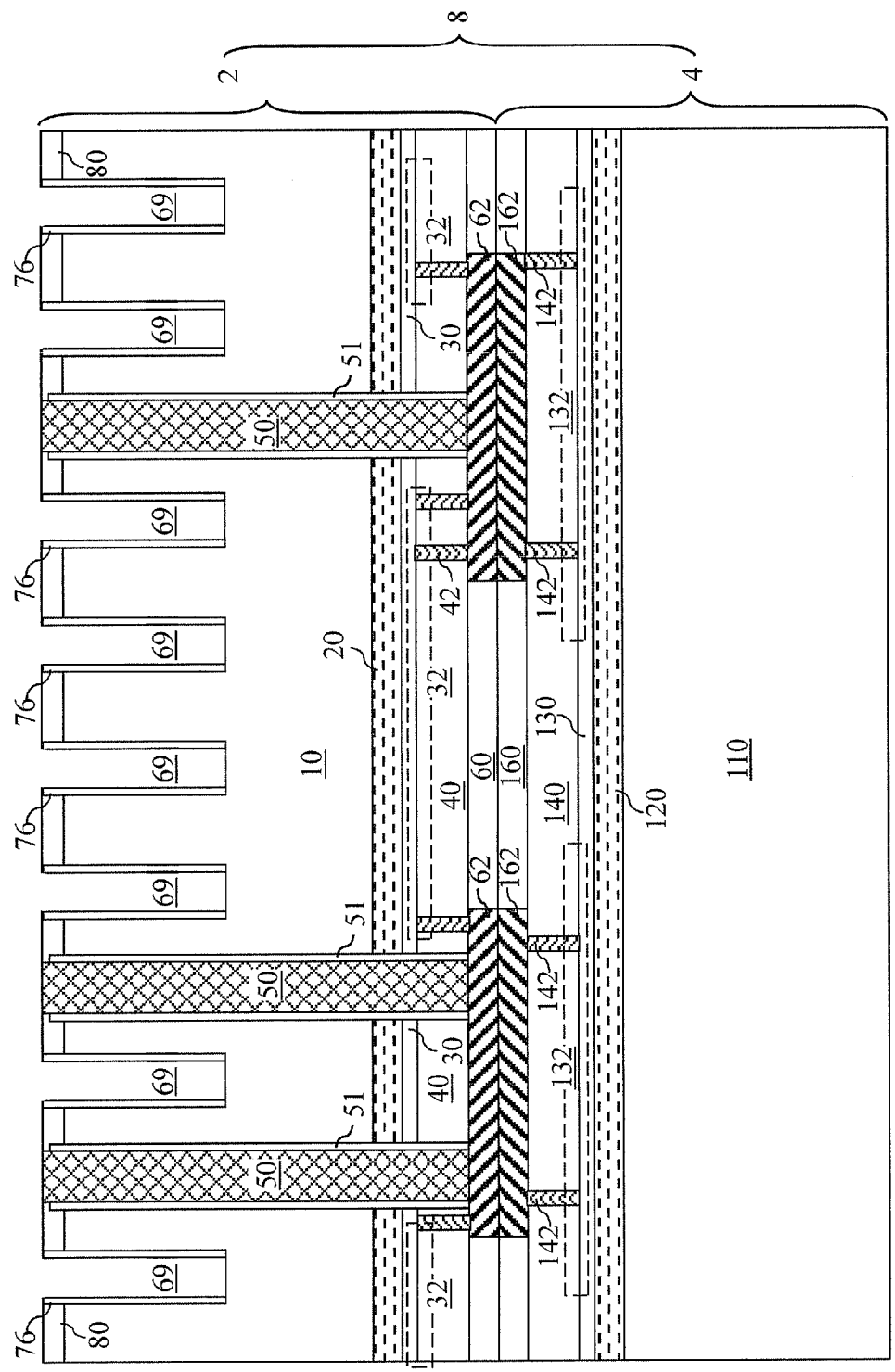

Referring to FIG. 19, an anisotropic etch is employed to remove horizontal portions of the contiguous dielectric liner 76L. The anisotropic etch can be reactive ion etch. Each remaining vertical portion of the contiguous dielectric liner 76L constitutes a dielectric liner 76, which covers sidewalls of one of the at least one trench 69. The dielectric material of the contiguous dielectric layer 76 is removed from the bottom surface of the at least one trench 69 so that the material of the first handle substrate 10 is exposed within each of the at least one trench 69. If the first handle substrate 10 is composed of a semiconductor material, the bottom surface of the at least one trench 69 is a semiconductor surface.

Figure 20:
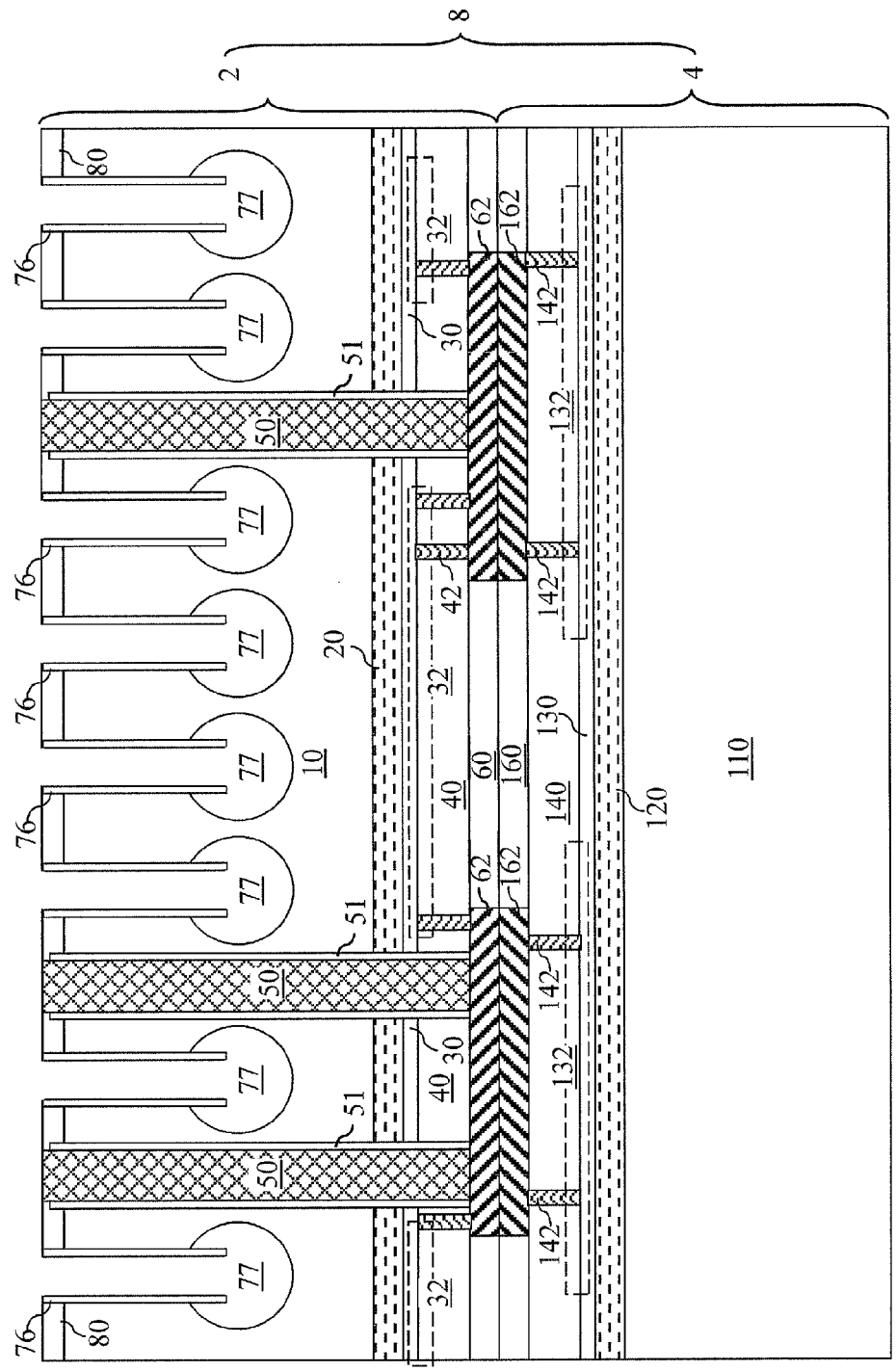

Referring to FIG. 20, a bottom portion of each of the at least one trench 69 is expanded to form at least one bottle-shaped trench 77. The expansion of the bottom portion of each of the at least one trench 69 can be effected by etching a material of the substrate, i.e., the material of the first handle substrate 10, through the bottom surface of each of the at least one trench 69. An isotropic etch can be employed to etch the material of the first handle substrate 10. For each bottle-shaped trench 77, a distance from the back side surface of the first substrate 2 exists at which the bottle-shaped trench 77 has a greater horizontal cross-sectional area than a horizontal cross-sectional area at a lesser distance from the back side surface.

Figure 21:
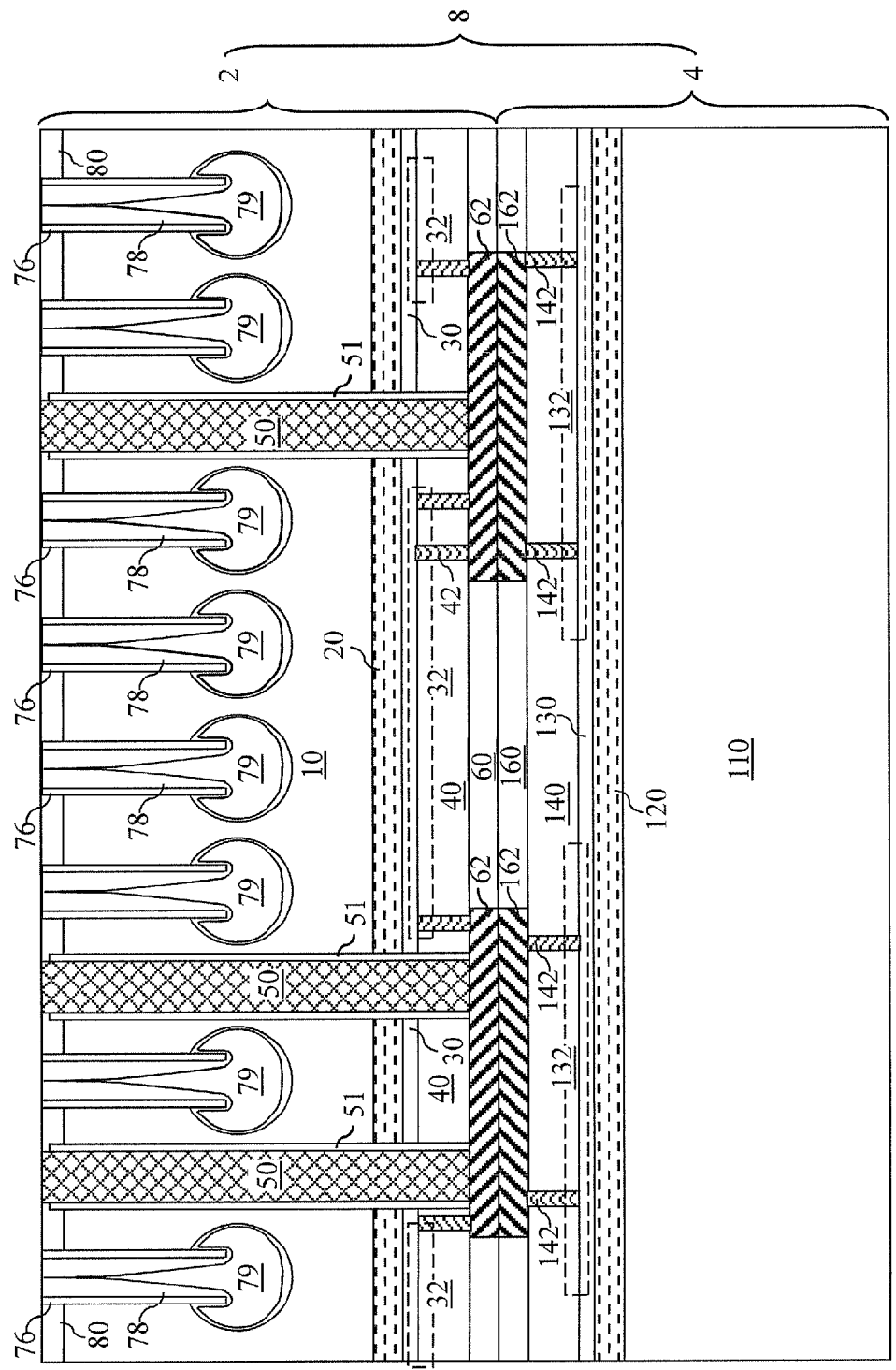

Referring to FIG. 21, a non-conformal dielectric material layer is deposited and planarized in the same manner as in processing steps in FIGS. 11 and 12 according to the second embodiment. Each of the at least one bottle-shaped trench 77 in FIG. 20 is partially filled with the dielectric material of the non-conformal dielectric material layer, thereby forming therein a cavity 79 located within the expanded region and surrounded by the dielectric material. Each of the at least one cavity 79 is sealed off by the dielectric material of the non-conformal dielectric material layer. The portion of the non-conformal dielectric material layer above the upper surface of the optional planarization dielectric layer 80 is removed by planarization The remaining portions of the non-conformal dielectric material layer constitute at least one dielectric backside dummy plug 78. Each of the at least one dielectric backside dummy plug 78 includes a cavity 79 therein. The top surfaces of the at least one dielectric backside dummy plug 78 is coplanar with the back side surface, i.e., the upper surface, of the first substrate 2 after planarization. The maximum lateral dimension of each of the at least one cavity 79 can be greater than the maximum lateral dimension of an upper portion of the at least one dielectric backside dummy plug 78 located within the same bottle shaped trench. Each of the at least one dielectric backside dummy plug 78 can completely seal all surfaces of a bottle shaped trench below the back surface of the first substrate 2, which can be the upper surface of the optional planarization dielectric layer 80.

Figure 22:
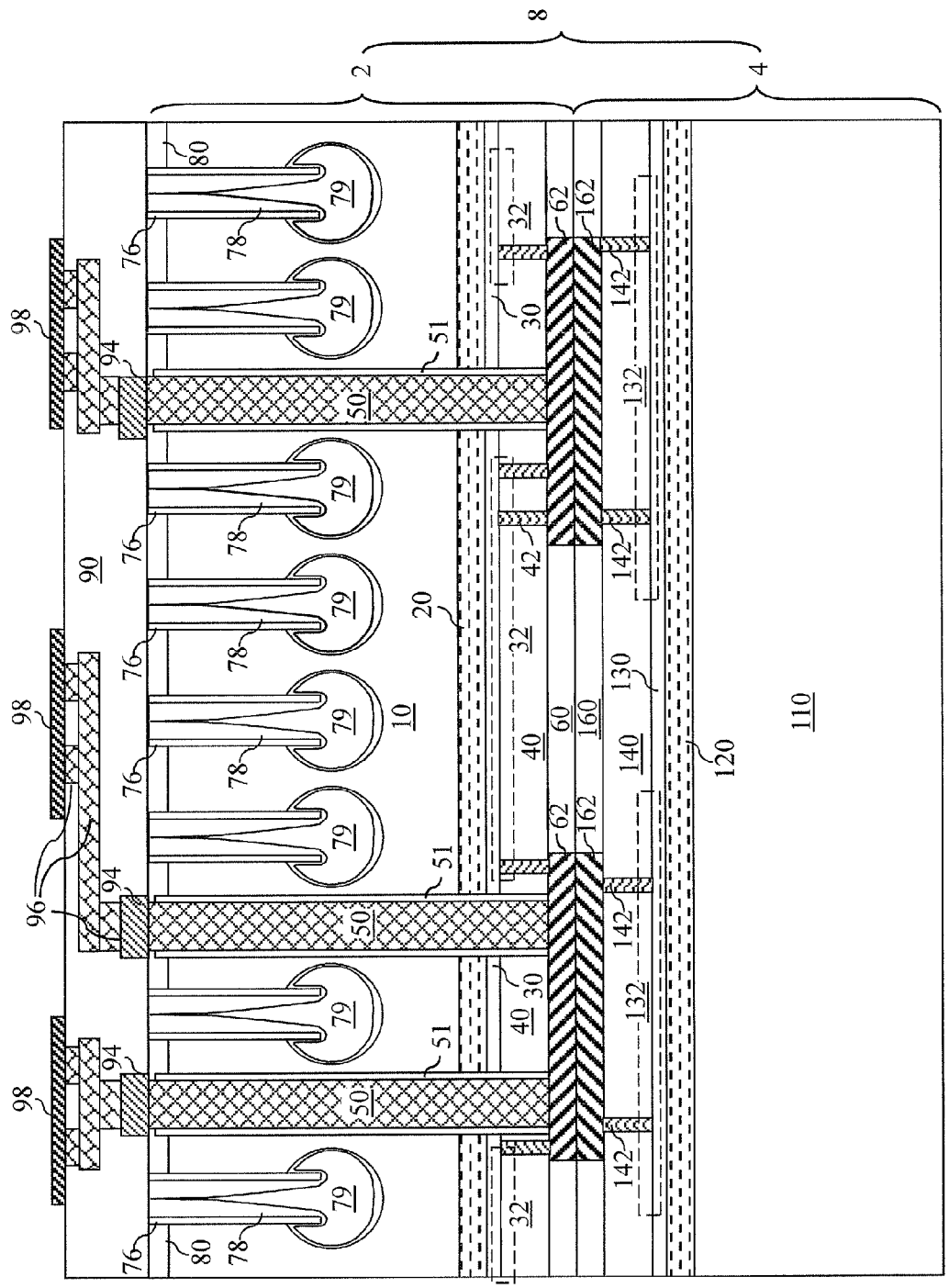

Referring to FIG. 22, first C4-wiring lines 94, at least one C4-level dielectric layer 90, C4-level metal interconnect structures 96, and C4 pads 98 can be formed in the same manner as in the first embodiment. Because the at least one dielectric backside dummy plug 78 is composed of a dielectric material, the at least one dielectric backside dummy plug 78 is not electrically biased.

The at least one dielectric backside dummy plug 78 extends from the back side surface of the first substrate 2 to a depth into the first substrate 2. This depth is greater the trench depth, i.e., the depth of the at least one trench 69, due to the expansion etch that forms the at least one bottle-shaped trench 77 at a processing step corresponding to FIG. 20. The depth is less than the vertical distance between the front side surface and the back side surface of the SOI substrate (80, 10, 20, 30). The vertical dimension of the at least one dielectric backside dummy plug 74 can be between 10% and 90% of the thickness of the SOI substrate (80, 10, 20, 30).

Each of the at least one TSV 50 is electrically isolated from the first substrate 2. The at least one dielectric backside dummy plug 78 is embedded in the first handle substrate 10. The at least one dielectric backside dummy plug 78 is not electrically shorted to the first handle substrate 10 because the at least one dielectric backside dummy plug 78 is composed of a dielectric material.

The first substrate 2 includes a semiconductor layer, which is the first top semiconductor layer 30, and the first interconnect dielectric layer 40. The at least one semiconductor device 32 is located at an interface between the semiconductor layer and the first interconnect dielectric layer 40. At least one TSV structure 50 is embedded in the first substrate 2. The at least one TSV structure 50 includes a conductive material and extends at least from the interface to the back side surface of the first substrate 2, which is the outer surface of the optional planarization dielectric layer 80. At least one dielectric backside dummy plug 78 is embedded in the first substrate 2. The at least one dielectric backside dummy plug 78 extends from the back side surface of the first substrate 2 to a depth into the first substrate 2. The depth is less than the vertical distance between the back side surface and the interface between the semiconductor layer and the first interconnect dielectric layer 40. The second substrate 4 is bonded to the front side surface of the first substrate 2. The first substrate 2 includes at least one first bonding pad 62 that are located on the front side of the first substrate 2 and bonded to at least one second bonding pad 162 that are located on the second substrate 4. Each of the at least one TSV structure 50 can be electrically shorted to a first bonding pad 62 and a second bonding pad 162.

At least one dielectric backside dummy plug 74 relieves mechanical stress in the first substrate 2. Preferably, the dielectric material of the at least one dielectric backside dummy plug 78 is a material that deforms easily upon application of stress. For example, the dielectric material of the at least one dielectric backside dummy plug 74 can be doped silicate glass. The dielectric material of the at least one dielectric backside dummy plug 78 accommodates volume changes of the components of the first substrate 2 during temperature cycling.

Figure 23:
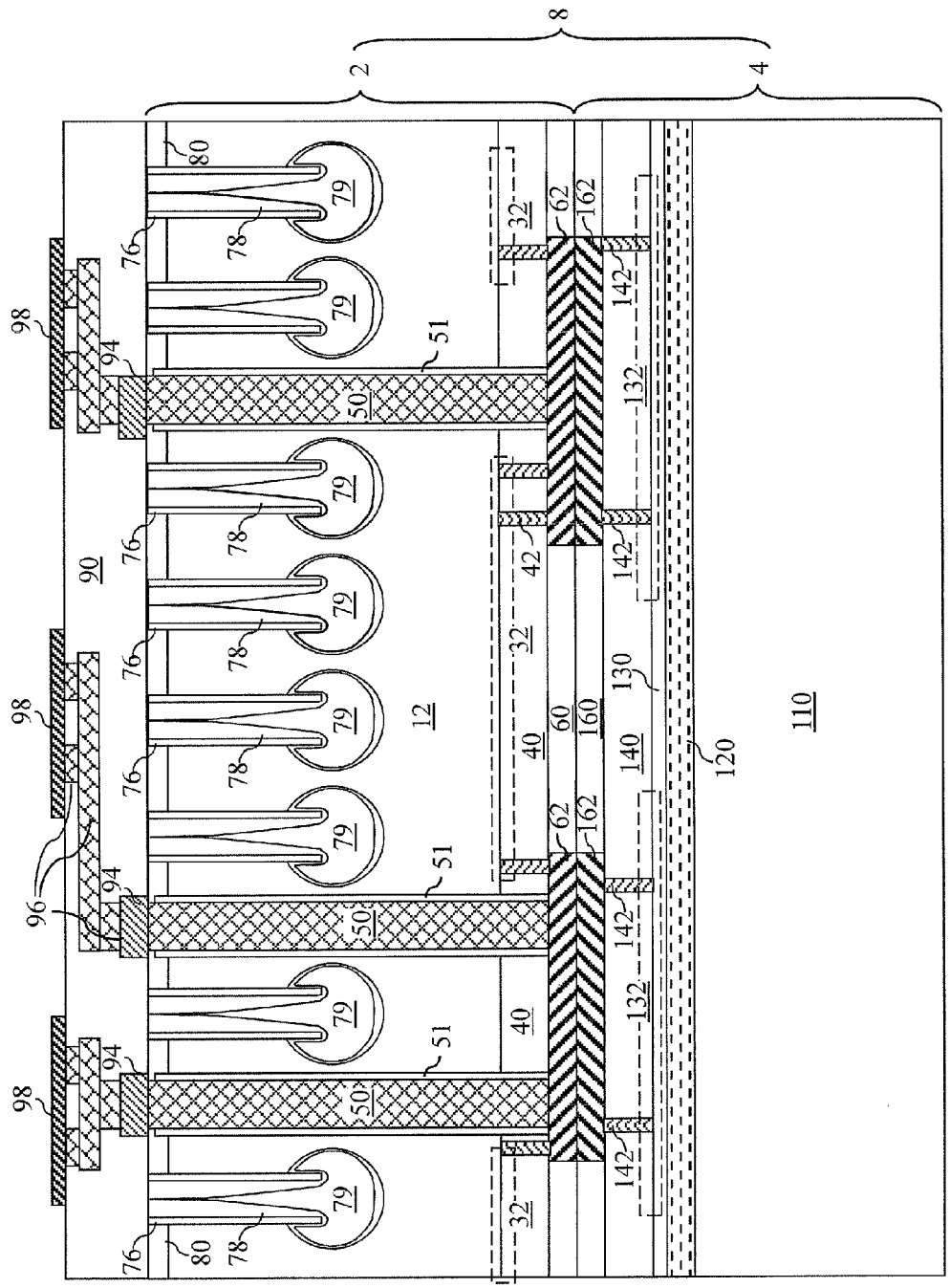
FIG. 23 is a vertical cross-sectional view of a variation of the fourth exemplary semiconductor structure according to the fourth embodiment of the present invention.

Referring to FIG. 23, a variation of the fourth exemplary semiconductor structure employs a bulk substrate 12 for the first substrate 2 instead of an SOT substrate (80, 10, 20, 30). The bulk substrate 12 can be composed of a single crystalline semiconductor material or a polycrystalline semiconductor material contiguously extending from the front side surface to the back side surface. The front side surface of the bulk substrate 12 is the interface between the bulk substrate 12 and the first interconnect dielectric layer 40.

Figure 24:
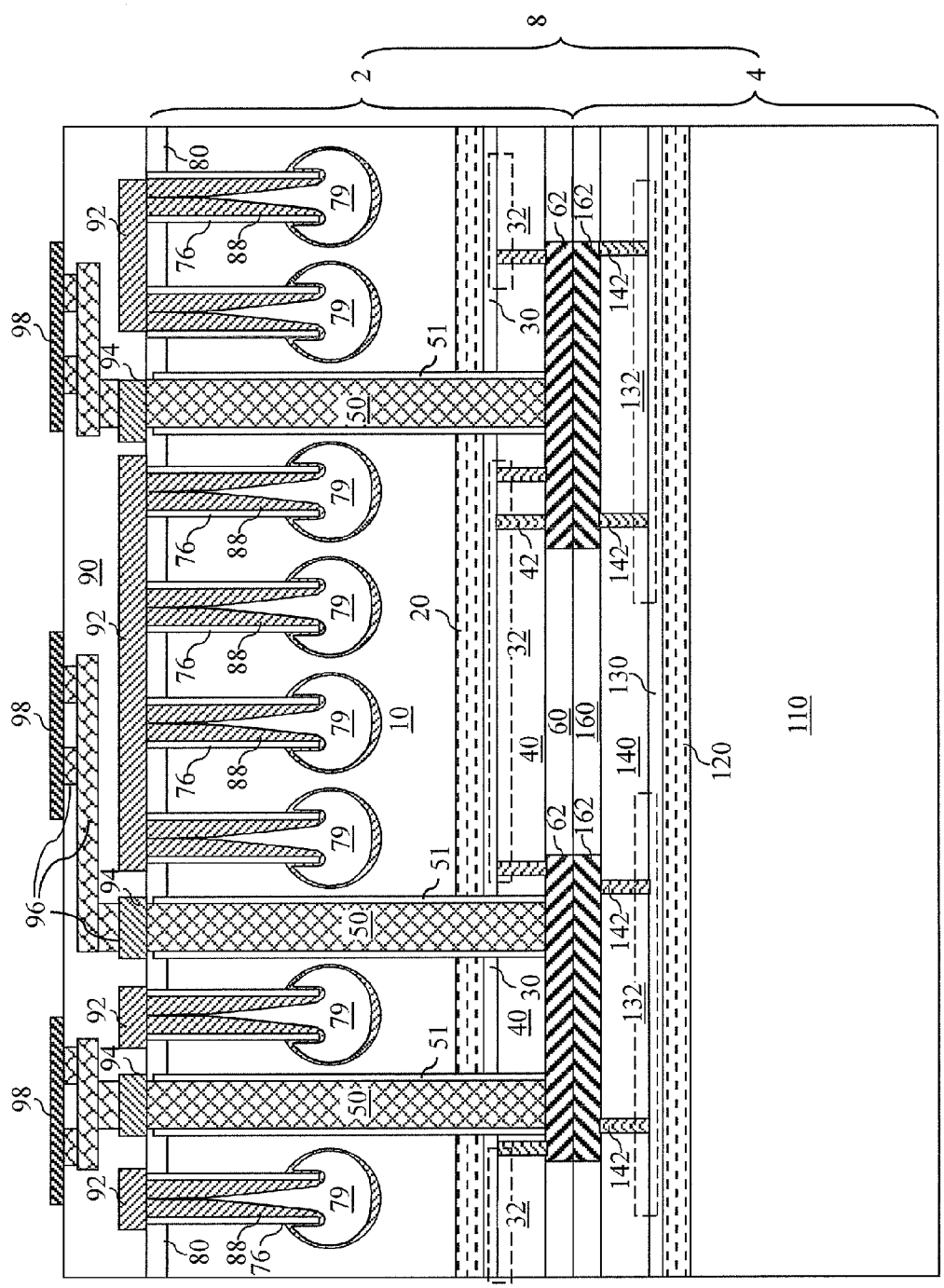
FIG. 24 is a vertical cross-sectional view of a fifth exemplary semiconductor structure according to a fifth embodiment of the present invention.

Referring to FIG. 24, a fifth exemplary semiconductor structure according to a fifth embodiment of the present invention is derived from the fourth exemplary semiconductor structure in FIG. 20 by depositing a non-conformal conductive material layer (not shown) instead of a non-conformal dielectric material layer as in the third embodiment. The thickness of the non-conformal conductive material layer is greater than one half of the lateral dimensions of the at least one trench 69. Each of the at least one bottle-shaped trench 77 is partially filled with the conductive material of the non-conformal conductive material layer, thereby forming therein a cavity 79 surrounded by the conductive material. Each of the at least one cavity 79 is sealed off by the conductive material of the non-conformal conductive material layer.

The portion of the non-conformal conductive material layer above the upper surface of the optional planarization dielectric layer 80 is removed by planarization as in the third embodiment. The remaining portions of the non-conformal conductive material layer constitute at least one conductive backside dummy plug 88. Each of the at least one conductive backside dummy plug 88 includes a cavity 79 therein. The top surfaces of the at least one conductive backside dummy plug 88 is coplanar with the back side surface, i.e., the upper surface, of the first substrate 2 after planarization.

First C4-wiring lines 94, second C4-wiring lines 92, at least one C4-level dielectric layer 90, C4-level metal interconnect structures 96, and C4 pads 98 can be formed in the same manner as in the first and third embodiments. The at least one conductive backside dummy plug 88 extends from the back side surface of the first substrate 2 to a depth into the first substrate 2. This depth is greater the trench depth, i.e., the depth of the at least one trench 69, due to the expansion etch that forms the at least one bottle-shaped trench 77 at a processing step corresponding to FIG. 20. The depth is less than the vertical distance between the front side surface and the back side surface of the SOI substrate (80, 10, 20, 30). The vertical dimension of the at least one conductive backside dummy plug 84 can between 10% and 90% of the thickness of the SOI substrate (80, 10, 20, 30). Each of the at least one TSV 50 is electrically isolated from the first substrate 2. The at least one conductive backside dummy plug 88 is embedded in the first handle substrate 10.

The first substrate 2 includes a semiconductor layer, which is the first top semiconductor layer 30, and the first interconnect dielectric layer 40. The at least one semiconductor device 32 is located at an interface between the semiconductor layer and the first interconnect dielectric layer 40. At least one TSV structure 50 is embedded in the first substrate 2. The at least one TSV structure 50 includes a conductive material and extends at least from the interface to the back side surface of the first substrate 2, which is the outer surface of the optional planarization dielectric layer 80. At least one conductive backside dummy plug 88 is embedded in the first substrate 2. The at least one conductive backside dummy plug 88 extends from the back side surface of the first substrate 2 to a depth into the first substrate 2. The depth is less than the vertical distance between the back side surface and the interface between the semiconductor layer and the first interconnect dielectric layer 40. The second substrate 4 is bonded to the front side surface of the first substrate 2. The first substrate 2 includes at least one first bonding pad 62 that are located on the front side of the first substrate 2 and bonded to at least one second bonding pad 162 that are located on the second substrate 4. Each of the at least one TSV structure 50 can be electrically shorted to a first bonding pad 62 and a second bonding pad 162.

At least one conductive backside dummy plug 88 relieves mechanical stress in the first substrate 2. Preferably, the conductive material of the at least one conductive backside dummy plug 88 is a malleable material that deforms easily upon application of stress. For example, the conductive material of the at least one conductive backside dummy plug 88 can be Au, Ag, Cu, or W. The conductive material of the at least one conductive backside dummy plug 88 accommodates volume changes of the components of the first substrate 2 during temperature cycling.

Figure 25:
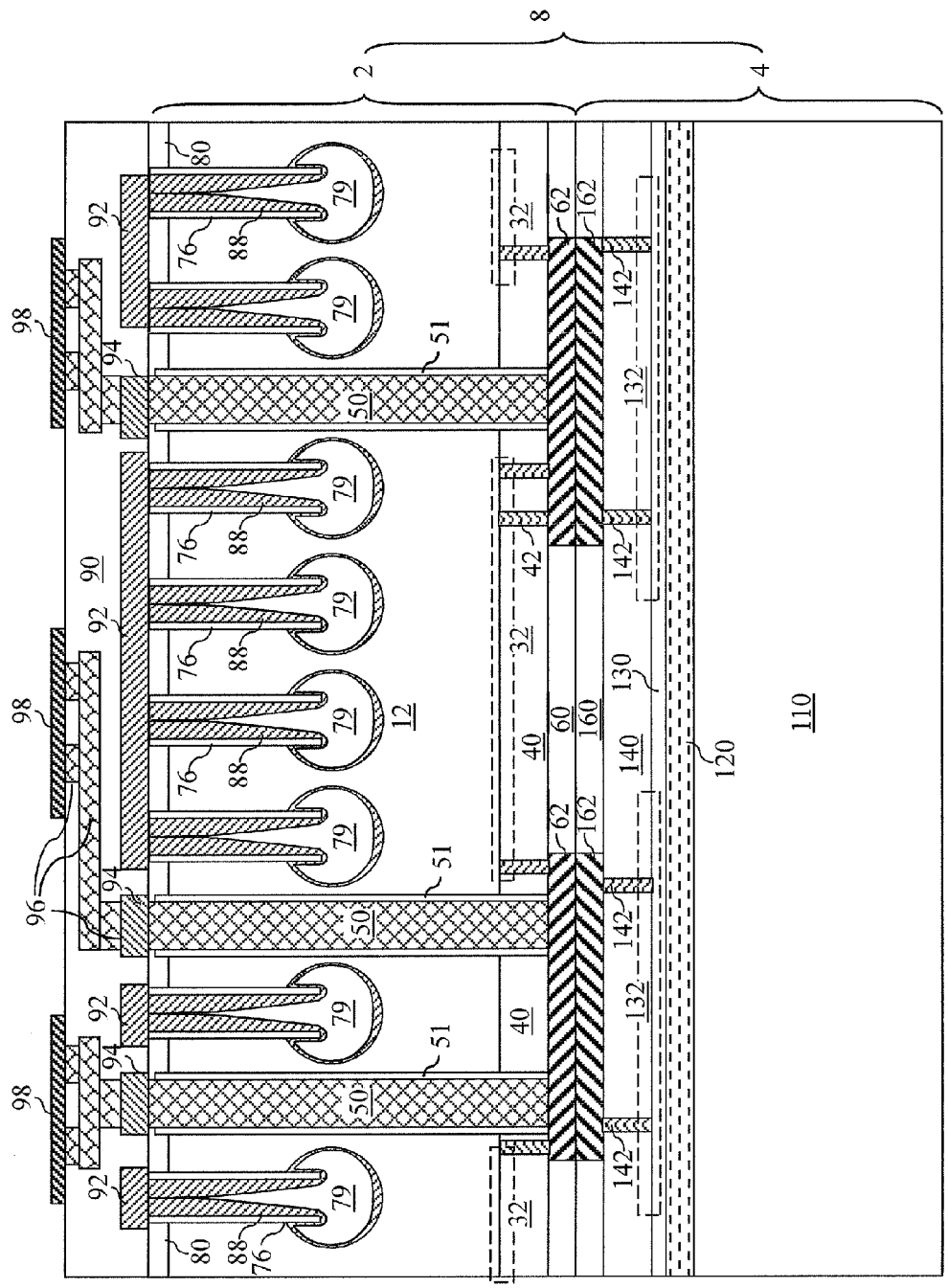
FIG. 25 is a vertical cross-sectional view of a variation of the fifth exemplary semiconductor structure according to the fifth embodiment of the present invention.

Referring to FIG. 25, a variation of the fifth exemplary semiconductor structure employs a bulk substrate 12 for the first substrate 2 instead of an SOI substrate (80, 10, 20, 30). The bulk substrate 12 can be composed of a single crystalline semiconductor material or a polycrystalline semiconductor material contiguously extending from the front side surface to the back side surface. The front side surface of the bulk substrate 12 is the interface between the bulk substrate 12 and the first interconnect dielectric layer 40.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims. For example, three or more chips could be stacked using this invention and/or through silicon vias could be used to connect the chips.

What is claimed is:

1. A semiconductor structure comprising:
    a substrate including a semiconductor layer and an interconnect dielectric layer, wherein at least one semiconductor device is located at an interface between said semiconductor layer and said interconnect dielectric layer;
    a through-substrate via (TSV) structure embedded in said substrate, said TSV structure comprising a conductive via material and extending at least from said interface to a back side surface of said substrate; and
    at least one backside dummy plug embedded in said substrate, said at least one backside dummy plug extending from said back side surface to a depth into said substrate, wherein said depth is less than a vertical distance between said back side surface and said interface, wherein at least one of said at least one backside dummy plug is filled with a conductive fill material that is separated and electrically insulated from the conductive via material of the TSV structure.

2. The semiconductor structure of claim 1, wherein said at least one backside dummy plug is a plurality of backside dummy plugs.

3. The semiconductor structure of claim 1, wherein said depth is between 10% and 90% of said vertical distance between said back side surface and said interface.

4. The semiconductor structure of claim 1, wherein said conductive fill material is selected from an elemental metal, an intermetallic alloy, a conductive metal nitride, a doped semiconductor material, and a combination thereof.

5. The semiconductor structure of claim 1, wherein said at least one backside dummy plug is completely filled with said conductive fill material.

6. The semiconductor structure of claim 5, wherein each of said at least one backside dummy plug completely fills a trench extending from said back side surface into said substrate, and said trench has a horizontal cross-sectional area that decreases with distance from said back side surface or is substantially constant with distance from said back side surface.

7. The semiconductor structure of claim 1, wherein said at least one backside dummy plug is partially filled with said conductive material, wherein each of said at least one backside dummy plug includes a cavity encapsulated by said conductive material.

8. The semiconductor structure of claim 7, wherein each of said at least one backside dummy plug partially fills a trench extending from said back side surface into said substrate, said cavity is located in said trench, and said trench has a horizontal cross-sectional area that decreases with distance from said back side surface or is substantially constant with distance from said back side surface.

9. The semiconductor structure of claim 7, wherein each of said at least one backside dummy plug partially fills a trench extending from said back side surface into said substrate, said cavity is located in said trench, and a distance from said back side surface exists at which said trench has a greater horizontal cross-sectional area than a horizontal cross-sectional area at a lesser distance from said back side surface.

10. The semiconductor structure of claim 1, wherein said at least one plug comprises a dielectric material.

11. The semiconductor structure of claim 10, wherein said at least one backside dummy plug is partially filled with said dielectric material, wherein each of said at least one backside dummy plug includes a cavity encapsulated by said dielectric material.

12. The semiconductor structure of claim 11, wherein each of said at least one backside dummy plug partially fills a trench extending from said back side surface into said substrate, said cavity is located in said trench, and said trench has a horizontal cross-sectional area that decreases with distance from said back side surface or is substantially constant with distance from said back side surface.

13. The semiconductor structure of claim 11, wherein each of said at least one backside dummy plug partially fills a trench extending from said back side surface into said substrate, said cavity is located in said trench, and a distance from said back side surface exists at which said trench has a greater horizontal cross-sectional area than a horizontal cross-sectional area at a lesser distance from said back side surface.

14. The semiconductor structure of claim 1, wherein said TSV structure is electrically isolated from said substrate, and said at least one backside dummy plug is embedded in a semiconductor material layer and is not electrically shorted to any portion of said semiconductor material layer.

15. The semiconductor structure of claim 1, wherein an end surface of said TSV and an end surface of each of said at least one backside dummy plug is coplanar with said back side surface of said substrate.

16. The semiconductor structure of claim 1, further comprising another substrate bonded to a front side surface of said substrate, wherein said substrate includes a first bonding pad located on said front side of said substrate and bonded to a second bonding pad located on said another substrate, and said TSV structure is electrically shorted to said first bonding pad and said second bonding pad.

* * * * *